(12) United States Patent
Wada et al.

(10) Patent No.: US 9,977,087 B2
(45) Date of Patent: May 22, 2018

(54) DEVICE AND METHOD FOR ESTIMATING REMAINING BATTERY CAPACITY

(71) Applicant: MITSUBISHI ELECTRIC CORPORATION, Chiyoda-ku (JP)

(72) Inventors: Toshihiro Wada, Chiyoda-ku (JP); Hisatoshi Fukumoto, Chiyoda-ku (JP); Hiroto Nishiguchi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 98 days.

(21) Appl. No.: 15/305,284

(22) PCT Filed: Feb. 5, 2015

(86) PCT No.: PCT/JP2015/053221
§ 371 (c)(1),
(2) Date: Oct. 19, 2016

(87) PCT Pub. No.: WO2015/162967
PCT Pub. Date: Oct. 29, 2015

(65) Prior Publication Data
US 2017/0038431 A1    Feb. 9, 2017

(30) Foreign Application Priority Data

Apr. 23, 2014    (JP) .................................. 2014-089005

(51) Int. Cl.
*G01R 31/36*    (2006.01)
*H01M 10/48*    (2006.01)
(Continued)

(52) U.S. Cl.
CPC ....... *G01R 31/3606* (2013.01); *G01R 19/165* (2013.01); *G01R 31/36* (2013.01);
(Continued)

(58) Field of Classification Search
CPC .. G01R 31/3651; G01R 19/165; G01R 31/36; G01R 31/3606; G01R 31/3624; G01R 31/3679; H01M 10/48; H02J 7/00
(Continued)

(56) References Cited

U.S. PATENT DOCUMENTS 2,864,055 A * 12/1958 Kordesch ............. G01R 31/362
                                                      320/136
6,107,779 A *  8/2000 Hara ................... G01R 31/3613
                                                      320/132
(Continued)

FOREIGN PATENT DOCUMENTS

JP    2003-168489 A    6/2003
JP    2006-98134 A     4/2006
(Continued)

OTHER PUBLICATIONS

International Search Report dated Apr. 21, 2015, in PCT/JP2015/053221 filed Feb. 5, 2015.

*Primary Examiner* — Jay Patidar
(74) *Attorney, Agent, or Firm* — Oblon, McClelland, Maier & Neustadt, L.L.P.

(57) ABSTRACT

This invention is concerning a device including a current calculator that calculates remaining capacity difference current on the basis of a first remaining battery capacity reflected on open-circuit voltage of a battery and a second remaining battery capacity not reflected on the open-circuit voltage, a first remaining capacity estimator that estimates the first remaining battery capacity on the basis of a value produced by removing the remaining capacity difference current from the current value of the battery and the inter-terminal voltage of the battery, a second remaining capacity calculator that calculates the second remaining battery capacity by adding up the remaining capacity difference current, and an adder that obtains a remaining battery
(Continued)

capacity of the battery by adding the estimate of the first remaining battery capacity and the calculation value of the second remaining battery capacity. The current calculator calculates the remaining capacity difference current so that the first remaining battery capacity and the second remaining battery capacity have a prescribed potential difference.

11 Claims, 17 Drawing Sheets

(51) Int. Cl.
    *H02J 7/00*     (2006.01)
    *G01R 19/165*     (2006.01)

(52) U.S. Cl.
    CPC ........ *G01R 31/3651* (2013.01); *H01M 10/48* (2013.01); *H02J 7/00* (2013.01)

(58) Field of Classification Search
    USPC .......................................................... 324/426
    See application file for complete search history.

(56) References Cited

U.S. PATENT DOCUMENTS

| | | |
|---|---|---|
| 6,285,163 B1 | 9/2001 | Watanabe et al. |
| 2005/0231164 A1 | 10/2005 | Melichar |
| 2005/0231165 A1 | 10/2005 | Melichar |
| 2005/0231166 A1 | 10/2005 | Melichar |
| 2006/0091861 A1 | 5/2006 | Melichar |
| 2006/0091862 A1 | 5/2006 | Melichar |
| 2006/0091863 A1 | 5/2006 | Melichar |

FOREIGN PATENT DOCUMENTS

| | | |
|---|---|---|
| JP | 2009-519469 A | 5/2009 |
| JP | 2013-158087 | 8/2013 |
| JP | 2013-213808 A | 10/2013 |
| WO | WO 99/45404 A1 | 9/1999 |
| WO | WO 99/61929 A1 | 12/1999 |
| WO | WO 2007/087023 A1 | 8/2007 |
| WO | WO 2013/069459 A1 | 5/2013 |

* cited by examiner

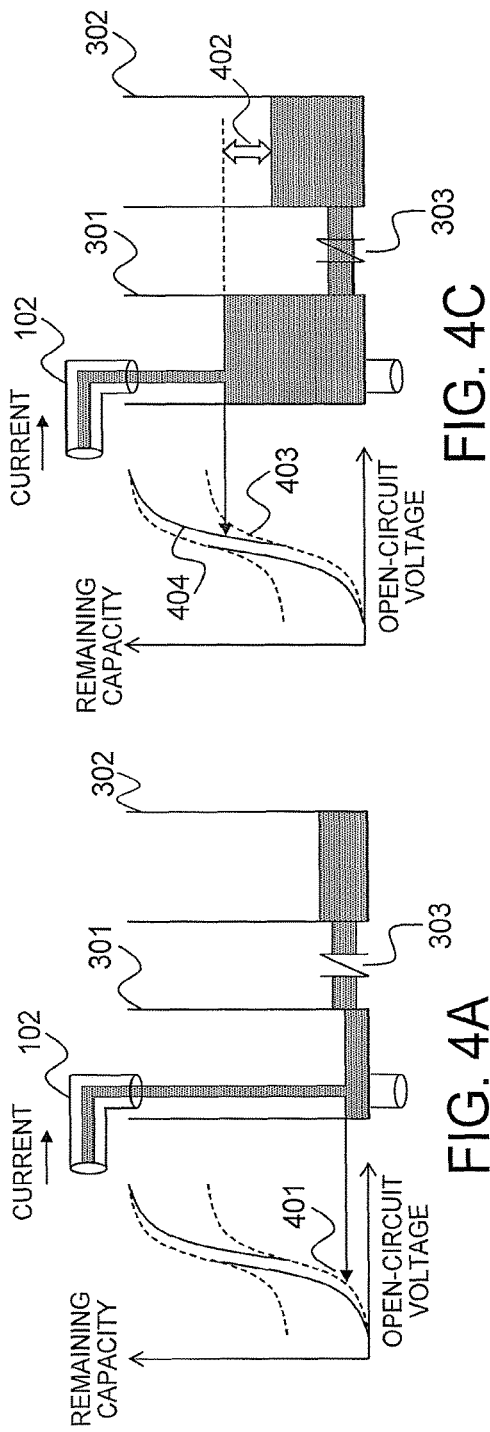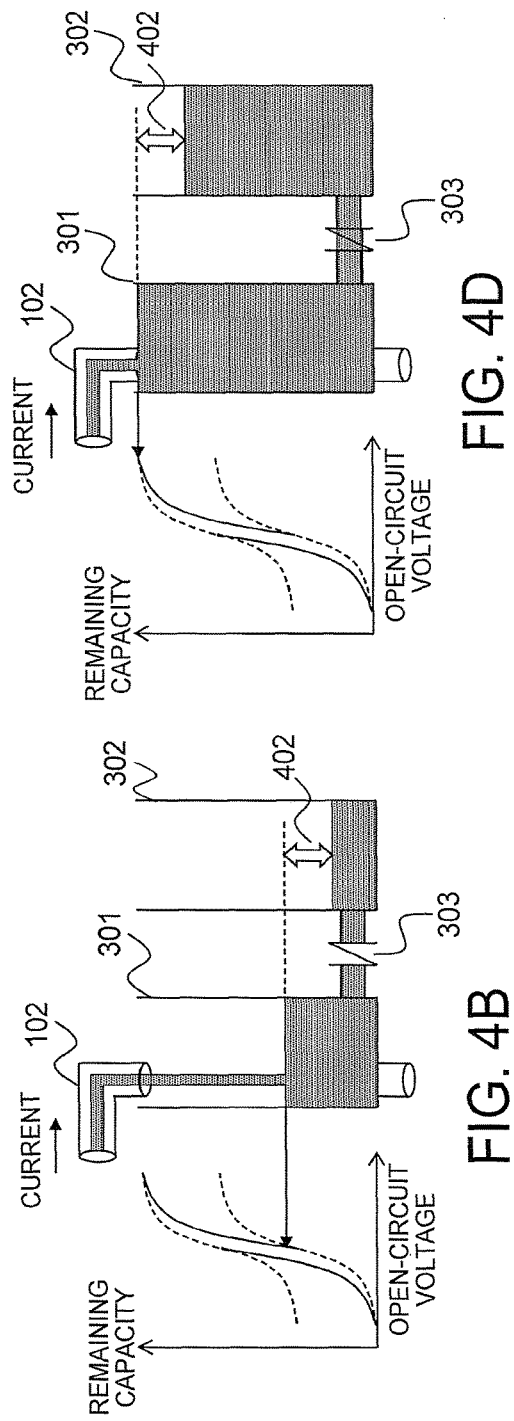

DEVICE AND METHOD FOR ESTIMATING REMAINING BATTERY CAPACITY

TECHNICAL FIELD

This invention relates to a remaining battery capacity estimating device and a remaining battery capacity estimating method for estimating the remaining capacity of a battery from current passed through the battery and voltage between battery terminals, and is particularly directed to improvement in the accuracy of remaining capacity estimation.

BACKGROUND ART

There are conventional remaining battery capacity estimating devices adapted to measure current passed through a battery and voltage between battery terminals, estimate open-circuit voltage of the battery using battery parameters, and carry out prescribed conversion with respect to the obtained open-circuit voltage to thereby estimate the remaining battery capacity (see for example Patent Literature 1). However, the relation of the remaining battery capacity to the open-circuit voltage is known to change depending on the history of use of the battery, or in other words, have hysteresis. Therefore, the remaining battery capacity estimating device according to Patent Literature 1 cannot accurately estimate the remaining battery capacity.

In order to address the problem, according to a conventional technique, a remaining capacity in which charging is switched to discharging is obtained as a remaining capacity for switching, and the association between different states of charge and open-circuit voltage for respective remaining capacities for switching is stored, so that a remaining battery capacity can be estimated with higher accuracy (see for example Patent Literature 2).

CITATION LIST

Patent Literature

[PTL 1]
  W/O 2013-111231
[PTL 2]
  W/O 2013-069459

SUMMARY OF INVENTION

Technical Problem

The conventional technique however includes the following problem.

The pattern of using a battery is not limited to either (1) starting charging from a fully discharged state, and switching to discharging in a certain remaining capacity level, followed by fully re-discharging or (2) starting discharging from a fully charged state, switching to charging in a certain remaining capacity level, followed by fully recharging. For example, there are cases where, normally, repetitive charging/discharging is carried out frequently around 50% SOC, and deep charging/discharging is carried out only occasionally.

Assume that a battery is charged from a fully discharged state (0% SOC) to around 60% SOC, then discharged to around 40% SOC, and then again switched to be charged. When the battery is used in such a pattern, the relation between the remaining battery capacity and the open-circuit voltage during the following charging is different from the relation between the remaining battery capacity and the open-circuit voltage when the battery is discharged from a fully charged state (100% SOC) to about 40% SOC, and then switched to be charged. Therefore, in this use pattern, the conventional remaining battery capacity estimating device cannot accurately estimate the remaining battery capacity.

The present invention is directed to a solution to the problems and it is an object of the present invention to provide a device and a method for estimating a remaining battery capacity that allow the remaining capacity of a battery, even those having hysteresis, to be accurately estimated regardless of the history of use of the battery.

Solution to Problem

A remaining battery capacity estimating device according to the present invention estimates a remaining battery capacity from inter-terminal voltage of a battery and current passed through the battery and includes a current measuring unit that measures the current, a voltage measuring unit that measures the inter-terminal voltage, a first remaining capacity storage that stores an estimate of the first remaining battery capacity defined as a remaining battery capacity correlated with open-circuit voltage of the battery, a second remaining capacity storage that stores a calculation value of the second remaining battery capacity defined as being uncorrelated with the open-circuit voltage of the battery, wherein increase and decrease in a total sum of the first remaining battery capacity and the second remaining battery capacity are defined as corresponding to the current passed through the battery, a current calculator that calculates remaining capacity difference current between the first remaining battery capacity and the second remaining battery capacity on the basis of the first remaining battery capacity and the second remaining battery capacity, a first remaining capacity estimator that estimates the first remaining battery capacity on the basis of a value obtained by removing the remaining capacity difference current from the current measured by the current measuring unit and the inter-terminal voltage measured by the voltage measuring unit and has the estimate stored in the first remaining capacity storage, a second remaining capacity calculator that calculates the second remaining battery capacity by adding up the remaining capacity difference current and has the result stored in the second remaining capacity storage, and an adder that obtains the remaining battery capacity of the battery by adding the estimate of the first remaining battery capacity stored in the first remaining capacity storage and the calculation value of the second remaining battery capacity stored in the second remaining capacity storage, and the current calculator calculates a quantity of current passed from the first remaining battery capacity to the second remaining battery capacity as the remaining capacity difference current so that the second remaining battery capacity is kept smaller than the first remaining battery capacity by a quantity corresponding to a first potential difference when the first remaining battery capacity increases during battery charging and calculates a quantity of current passed from the second remaining battery capacity to the first remaining battery capacity as the remaining capacity difference current so that the first remaining battery capacity is kept smaller than the second remaining battery capacity by a quantity corresponding to a second potential difference when the first remaining battery capacity decreases during battery discharging.

A method for estimating a remaining battery capacity according to the present invention is a method for estimating a remaining battery capacity from inter-terminal voltage of a battery and current passed through the battery and includes a current calculating step of calculating remaining capacity difference current between a first remaining battery capacity and a second remaining battery capacity on the basis of the first and second remaining battery capacities, wherein the first remaining battery capacity is defined as being correlated with open-circuit voltage of the battery, the second remaining battery capacity is defined as being uncorrelated with the open-circuit voltage, and increase and decrease in a total sum of the second remaining battery capacity and the first remaining battery capacity are defined as corresponding to the current passed through the battery, a first remaining capacity estimating step of estimating the first remaining battery capacity on the basis of a value produced by removing the remaining capacity difference current from the current passed through the battery measured by a current measuring unit and the inter-terminal voltage measured by a voltage measuring unit that measures voltage and having the estimate stored in the first remaining capacity storage, a second remaining capacity calculating step of calculating a second remaining battery capacity by adding up the remaining capacity difference current and having the second remaining battery capacity stored in a second remaining capacity storage, and an addition step of adding the estimate of the first remaining battery capacity stored in the first remaining capacity storage and the calculation value of the second remaining battery capacity stored in the second remaining capacity storage, the current calculating step includes calculating a quantity of current passed from the first remaining battery capacity to the second remaining battery capacity as the remaining capacity difference current so that the second remaining battery capacity is kept smaller than the first remaining battery capacity by a quantity corresponding to a first potential difference when the first remaining battery capacity increases during battery charging and calculating a quantity of current passed from the second remaining battery capacity to the first remaining battery capacity so that the first remaining battery capacity is kept smaller than the second remaining battery capacity by a quantity corresponding to a second potential difference when the first remaining battery capacity decreases during battery discharging.

Advantageous Effects of Invention

The present invention takes into consideration the first remaining battery capacity defined as a remaining battery capacity correlated with open-circuit voltage of the battery and the second remaining battery capacity defined as being uncorrelated with the open-circuit voltage of the battery wherein increase and decrease in the total of the first and second remaining battery capacities are defined as corresponding to the current passed through the battery, the capabilities of estimating the first remaining battery capacity, calculating the second remaining battery capacity, and calculating current for remaining battery capacity difference depending on the first and second remaining battery capacities are provided, and therefore a device and a method for estimating a remaining battery capacity that allow the remaining capacity of a battery, even those having hysteresis, to be accurately estimated regardless of the history of use of the battery.

BRIEF DESCRIPTION OF DRAWINGS

FIG. 4A shows the behavior of a remaining battery capacity estimating device according to the first embodiment of the present invention during battery charging.

FIG. 4B shows the behavior of a remaining battery capacity estimating device according to the first embodiment of the present invention during battery charging.

FIG. 4C shows the behavior of a remaining battery capacity estimating device according to the first embodiment of the present invention during battery charging.

FIG. 4D shows the behavior of a remaining battery capacity estimating device according to the first embodiment of the present invention during battery charging.

DESCRIPTION OF EMBODIMENTS

Below, a device and a method for estimating a remaining battery capacity according to a preferred embodiment of the present invention will be described with reference to the accompanying drawings.

First Embodiment

Figure 1:
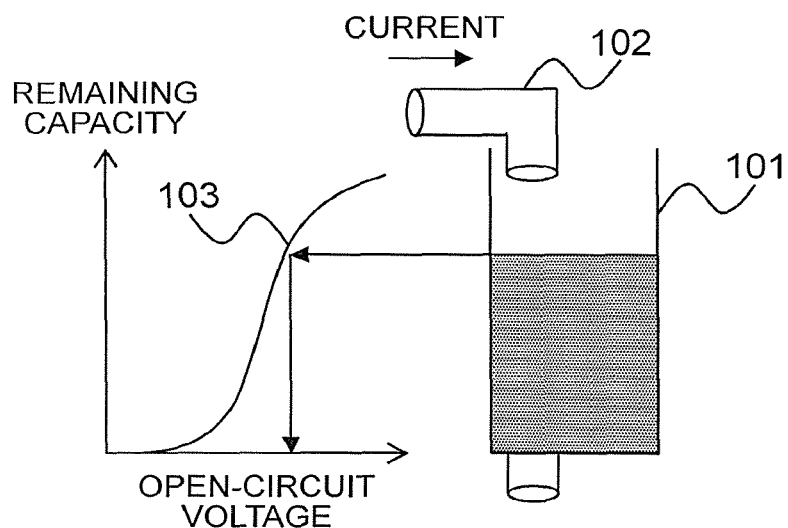
FIG. 1 shows a conventional model for a remaining battery capacity and the relation between the remaining battery capacity and open-circuit voltage.

First, disadvantages associated with the state-of-the-art estimation for a remaining battery capacity will be described in conjunction with the drawings. FIG. 1 shows a conventional model for a remaining battery capacity and the relation between the remaining battery capacity and open-circuit voltage. Water stored in a water tank represents a remaining battery capacity 101 and increase and decrease in the remaining capacity can be represented by current 102 passed through the battery. The curve 103 represents the relation between the remaining battery capacity and the open-circuit voltage.

Figure 2:
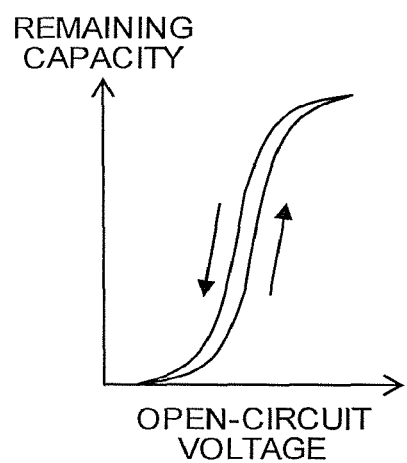
FIG. 2 is a graph showing the relation between a remaining battery capacity and open-circuit voltage in reality.

In the meantime, FIG. 2 is a graph showing the relation between a remaining battery capacity and open-circuit voltage in reality. As shown in FIG. 2, when an actual battery is charged and discharged and measured for the relation between the remaining battery capacity and the open-circuit voltage, a hysteresis property is observed. More specifically, higher open-circuit voltage is measured for the same remaining battery capacity when the battery is charged from a fully discharged state, and lower open-circuit voltage is measured for the same remaining battery capacity when the battery is discharged from a fully charged state.

In Patent Literature 1, the disclosed technique includes the step of estimating a remaining battery capacity from open-circuit voltage using the relation between the remaining battery capacity and the open-circuit voltage. Therefore, when the remaining battery capacity and the open-circuit voltage do not correspond on a one-to-one basis, the remaining battery capacity cannot be estimated accurately.

Figure 3:
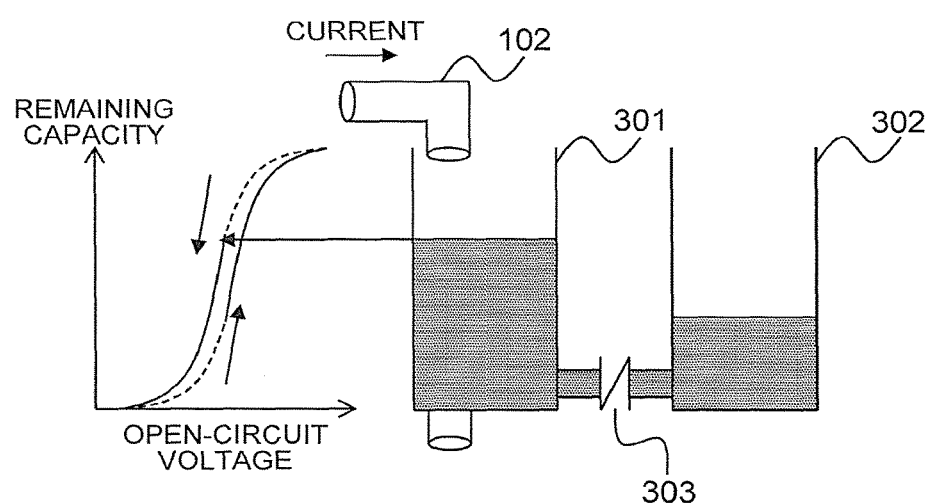
FIG. 3 shows a model for a remaining battery capacity and the relation between the remaining battery capacity and open-circuit voltage according to a first embodiment of the present invention.

Therefore, an approach that allows for accurate estimation of the remaining capacity of a battery, regardless of the history of use of the battery and even for a battery that has hysteresis, according to the first embodiment will be described. FIG. 3 shows a model for a remaining battery capacity and the relation between the remaining battery capacity and the open-circuit voltage according to the first embodiment of the present invention.

In the model shown in FIG. 3 according to the first embodiment, a first remaining battery capacity 301 that is reflected on the open-circuit voltage of the battery and a second remaining battery capacity 302 that is not reflected on the open-circuit voltage of the battery are considered, and increase and decrease in the total sum of the first and second remaining battery capacities 301 and 302 corresponds to current 102.

Herein, the expression "the first remaining battery capacity 301 that is reflected on the open-circuit voltage of the battery" indicates that the first remaining battery capacity 301 corresponds to the remaining battery capacity represented by the vertical axis in FIG. 3 and the relation between the first remaining battery capacity 301 and the open-circuit voltage is reflected on a one-to-one basis. More specifically, the first remaining battery capacity 301 is defined as a remaining battery capacity correlated with the open-circuit voltage of the battery.

The expression "the second remaining battery capacity 302 that is not reflected on the open-circuit voltage of the battery" indicates that the second remaining battery capacity 302 is not directly related with the remaining battery capacity represented by the vertical axis in FIG. 3, and the relation between the second remaining battery capacity 302 and the open-circuit voltage is not reflected on a one-to-one basis. More specifically, unlike the first remaining battery capacity, the second remaining battery capacity 302 is defined as a remaining battery capacity uncorrelated with the open-circuit capacity of the battery, and increase and decrease in the total sum of the first and second remaining battery capacities 301 and 302 are defined as corresponding to the current 102 passed through the battery.

Exchange of the quantity of electricity between the first remaining battery capacity 301 and the second remaining battery capacity 302 is controlled by a control valve 303 that opens/closes depending on the difference between the first remaining battery capacity 301 and the second remaining battery capacity 302.

Now, the behavior of the model shown in FIG. 3 during battery charging and discharging of the battery will be described with reference to the drawings. FIGS. 4A to 4D show the behavior of the remaining battery capacity estimating device according to the first embodiment of the present invention during battery charging, and changes in the first remaining battery capacity 301 and the second remaining battery capacity 302 are shown in four stages A to D.

When the battery is charged from a fully discharged state, the control valve 303 is closed as shown in FIG. 4A. More specifically, the current 102 coining into the battery increases the first remaining battery capacity 301 only. At the time, the relation between the total remaining battery capacity and the open-circuit voltage is indicated by the dotted line 401 in FIG. 4A.

The control valve 303 opens as the total remaining battery capacity increases by charging and a prescribed potential difference 402 (represented as water pressure difference or difference in water surface level in FIGS. 4A to 4D) during charging is generated between the first remaining battery capacity 301 and the second remaining battery capacity 302 as shown in FIG. 4B.

As the charging further continues, the control valve 303 is kept open as shown in FIG. 4C, and current is passed from the first remaining battery capacity 301 to the second remaining battery capacity 302 so that the potential difference 402 is maintained.

If the control valve 303 is not opened at the time, the remaining battery capacity increases according to the dotted line 403 in FIG. 4C. However, since the control valve 303 is opened, change in the first remaining battery capacity 301 with respect to the current 102 decreases as compared to the case in which the control valve 303 is not opened. As a result, the relation between the total remaining battery capacity and the open circuit voltage follows the curve formed by extending the dotted line 403 in FIG. 4C in the remaining capacity direction. (In other words, the relation follows the solid line 404 in FIG. 4C.)

In FIG. 4D, the battery is in a fully charged state. The second remaining battery capacity 302 has a prescribed potential difference 402 during charging with respect to the first remaining battery capacity 301 in a fully charged state.

The state with the prescribed potential difference is unique regardless of charging/discharging process.

In the meantime, FIGS. 5A to 5D show the behavior of the remaining battery capacity estimating device according to the first embodiment of the present invention during battery discharging, and changes in the first and second remaining battery capacities 301 and 302 are shown in four stages A to D.

Figure 5A:
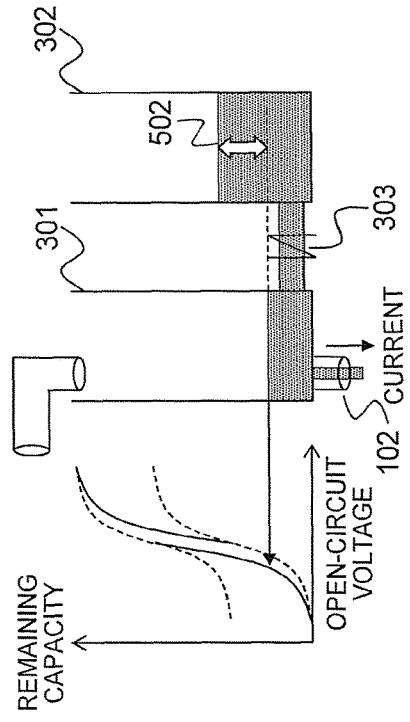
FIG. 5A shows the behavior of the remaining battery capacity estimating device according to the first embodiment of the present invention during battery discharging.

When discharging starts from the state in FIG. 4D and then the state in FIG. 5A is attained, the potential difference between the first remaining battery capacity 301 and the second remaining battery capacity 302 is not more than a prescribed potential difference 502 during discharging. (The prescribed potential difference 502 during discharging may be different from the prescribed potential difference 402 during charging as described above.)

At the time, the control valve 303 is closed, and the current 102 passed through the battery reduces the first remaining battery capacity 301 only. The relation between the total remaining battery capacity and the open-circuit voltage follows the dotted line 501 in FIG. 5A in this state. This corresponds to what is obtained by translating the dotted line 403 in FIG. 4C.

Figure 5C:
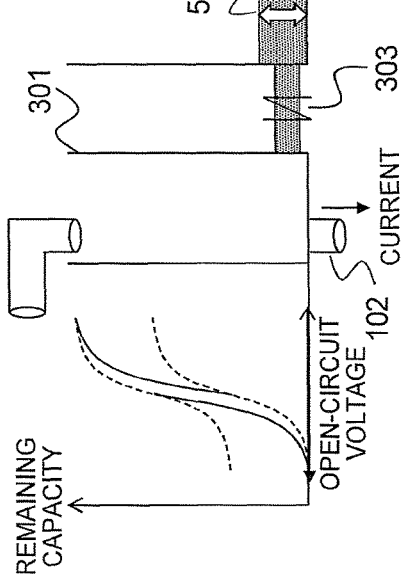
FIG. 5C shows the behavior of the remaining battery capacity estimating device according to the first embodiment of the present invention during battery discharging.
Figure 5B:
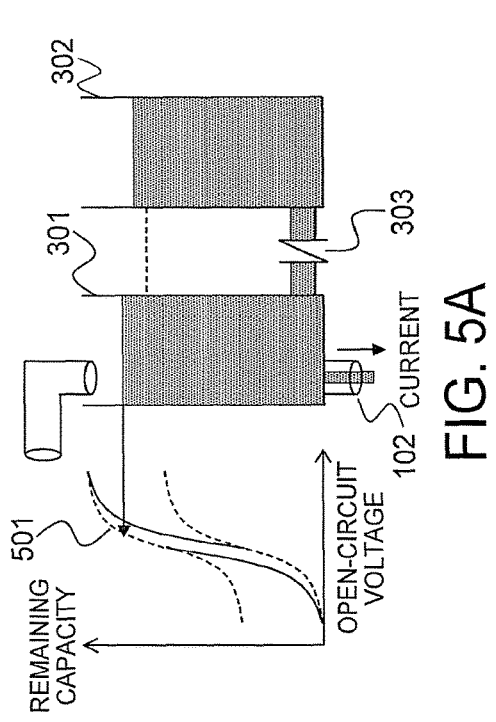
FIG. 5B shows the behavior of the remaining battery capacity estimating device according to the first embodiment of the present invention during battery discharging.

As the discharging continues and the prescribed potential difference 502 is generated between the first remaining battery capacity 301 and the second remaining battery capacity 302 as shown in FIG. 5B, the control valve 303 is opened again to pass current from the second remaining battery capacity 302 to the first remaining battery capacity 301 so that the prescribed potential difference 502 is maintained.

As the discharging further continues, the control valve 303 is kept open as shown in FIG. 5C to pass current from the second remaining battery capacity 302 to the first remaining battery capacity 301 so that the potential difference 502 is maintained.

Figure 5D:
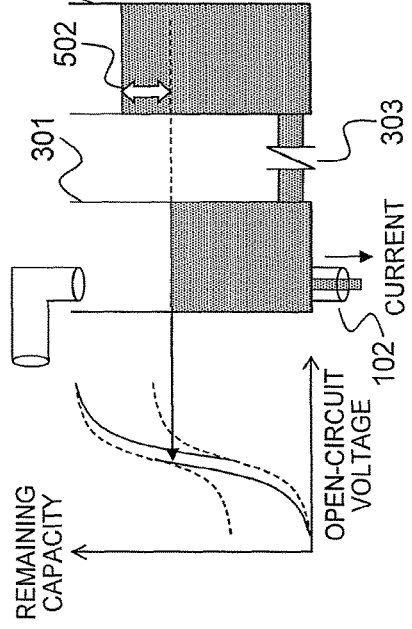
FIG. 5D shows the behavior of the remaining battery capacity estimating device according to the first embodiment of the present invention during battery discharging.

FIG. 5D shows the battery in a fully discharged state. The second remaining battery capacity 302 is equal to a capacity with the prescribed potential difference 502 during discharging as compared to the first remaining battery capacity 301 in the fully discharged state. The state with the prescribed potential difference is unique regardless of charging/discharging process.

Not only when the battery is charged/discharged between the fully discharged state and the fully charged state but also when charging and discharging are switched in an intermediately charged state, the control valve 303 is subjected to the opening/closing control described in conjunction with FIGS. 4 and 5. More specifically, the control valve 303 is controlled to be opened and closed so that the potential difference between the first remaining battery capacity 301 and the second remaining battery capacity 302 is kept equal to or less than the prescribed potential difference 402 during charging and equal to or less the prescribed potential difference 502 during discharging. In this way, in any charging/discharging process, the relation between the total remaining battery capacity and the open-circuit voltage can be represented accurately in consideration of hysteresis.

Figure 6:
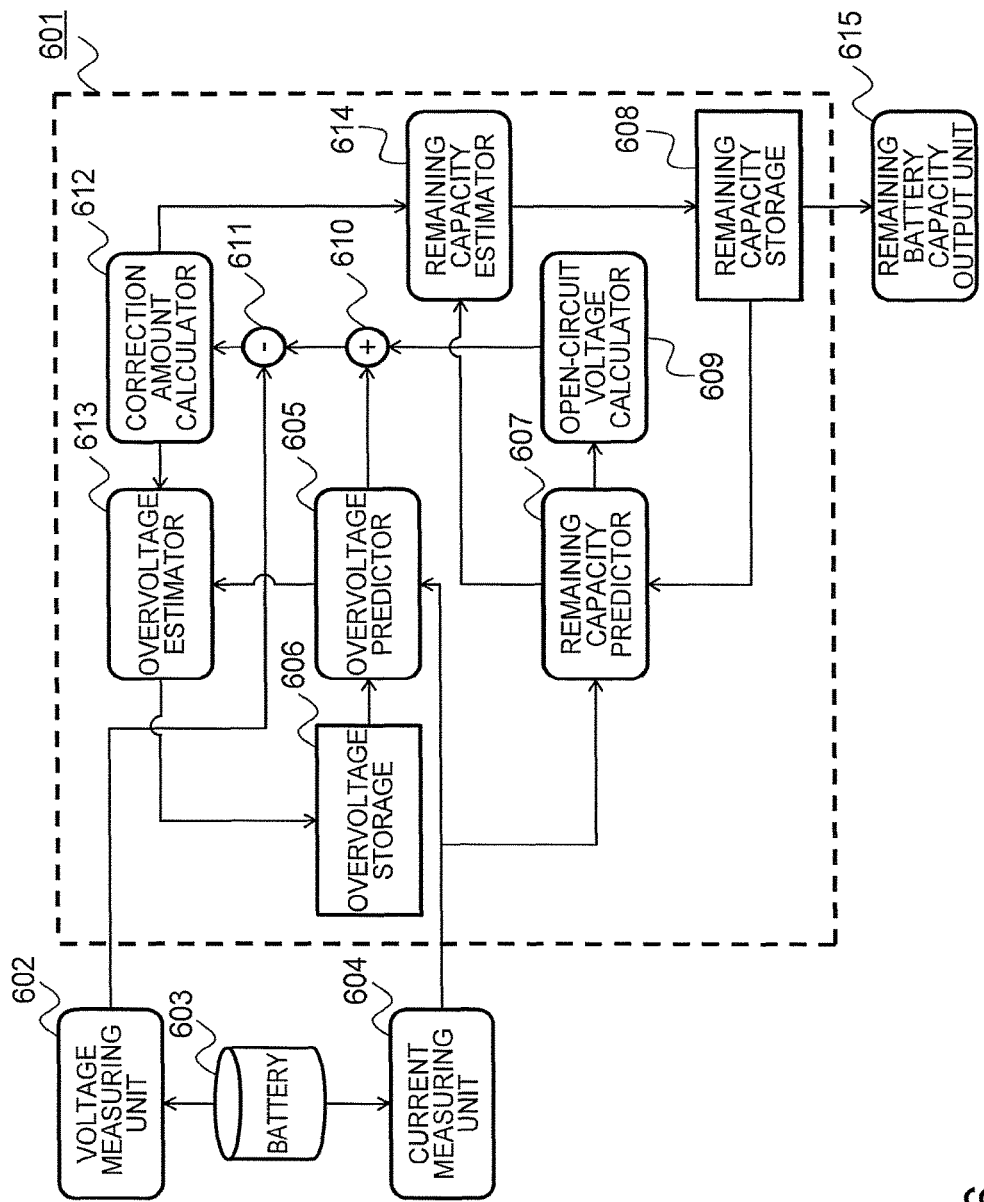
FIG. 6 is a diagram of an overall configuration of a remaining battery capacity estimating device not according to the present invention.

Now, the conventional device and the remaining battery capacity estimating device according to the first embodiment will be compared in terms of their device configurations. FIG. 6 is a diagram showing an overall configuration of the remaining battery capacity estimating device 601 not according to the present invention. A voltage measuring unit 602 measures inter-terminal voltage of a battery 603 at prescribed sampling time intervals. A current measuring unit 604 measures current 102 passed through the battery 603 at prescribed sampling time intervals.

An overvoltage predictor 605 predicts the present overvoltage from an estimate of overvoltage at the preceding sampling time stored in an overvoltage storage 606 and the current 102 passed through the battery 603 measured by the current measuring unit 604.

In the meantime, a remaining capacity predictor 607 predicts the present remaining battery capacity 101 from an estimate of the remaining battery capacity 101 at the preceding sampling time stored in a remaining capacity storage 608 and the current 102 passed through the battery 603 measured by the current measuring unit 604. An open-circuit voltage calculator 609 calculates the present open-circuit voltage on the basis of the curve 103 from the predictive value of the present remaining battery capacity 101 predicted by the remaining capacity predictor 607.

An adder 610 calculates a predictive value of the inter-terminal voltage of the battery 603 by adding the predictive value of overvoltage predicted by the overvoltage predictor 605 and the open-circuit voltage calculated by the open-circuit voltage calculator 609.

A difference calculator 611 obtains the difference between the value of the inter-terminal voltage of the battery 603 measured by the voltage measuring unit 602 and the predictive value of the inter-terminal voltage of the battery 603 obtained by the adder 610. A correction amount calculator 612 calculates respective correction amounts for the overvoltage and the remaining battery capacity 101 from the voltage difference calculated by the difference calculator 611.

An overvoltage estimator 613 estimates the overvoltage of the battery 603 from the predictive value of the overvoltage predicted by the overvoltage predictor 605 and the correction amount for the overvoltage calculated by the correction amount calculator 612 and has the resulting estimate stored in the overvoltage storage 606. A remaining capacity estimator 614 estimates the remaining battery capacity 101 from the predictive value of the remaining battery capacity 101 predicted by the remaining capacity predictor 607 and the correction amount for the remaining battery capacity calculated by the correction amount calculator 612 and has the resulting estimate stored in the remaining capacity storage 608.

A remaining battery capacity output unit 615 outputs the estimate of the present remaining battery capacity 101 stored in the remaining capacity storage 608.

Figure 7:
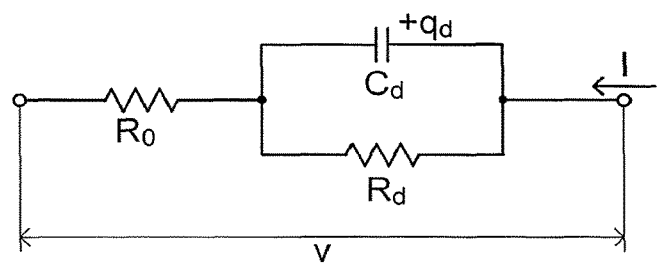
FIG. 7 is an equivalent circuit diagram of a battery according to the first embodiment of the present invention.

Now, the operation of each component will be described more specifically using mathematical expressions. FIG. 7 is an equivalent circuit diagram of a battery according to the first embodiment of the present invention. The overvoltage predictor 605 predicts the present overvoltage for example from the current 102 passed through the battery 603 and an estimate of overvoltage at the preceding sampling time stored in the overvoltage storage 606, on the basis of the equivalent circuit of the battery 603 as shown in FIG. 7.

When the current 102 passed through the battery 603 is I[A] and the charge stored in the capacitor in the equivalent circuit is qd[C], qd follows the following differential expression (1).

[Math. 1]

$$\frac{d}{dt}q_d(t) = -\frac{1}{C_d R_d}q_d(t) + I(t) \quad (1)$$

In the expression, Cd is the capacitance [C] of the capacitor in FIG. 7, and Rd is the resistance [Ω] in FIG. 7. The overvoltage v[V] is represented using the charge qd by the following expression (2).

[Math. 2]

$$v(t) = \frac{1}{C_d} q_d(t) + R_0 I(t) \quad (2)$$

Note that in the expression, $R_0$ is the resistance [Ω] in FIG. 7. Solving the above expressions (1) and (2) results in the following expression (3) as a general solution.

[Math. 3]

$$v(t) = e^{-\frac{1}{C_d R_d}(t-t_0)} v(t_0) + \frac{1}{C_d} \int_{t_0}^{t} e^{-\frac{1}{C_d R_d}(t-\tau)} I(\tau) d\tau + R_0 I(t) \quad (3)$$

From the above, when the sampling interval is h[s], the estimate of the overvoltage at the preceding sampling time is ve[V], the predictive value of the overvoltage is vp[V], and the present time is t[s], the predictive value vp of the overvoltage is represented by the following expression (4).

[Math. 4]

$$v_p = e^{-\frac{1}{C_d R_d} h} v_e + \frac{1}{C_d} \int_{t-h}^{t} e^{-\frac{1}{C_d R_d}(t-\tau)} I(\tau) d\tau + R_0 I(t) \quad (4)$$

The overvoltage predictor 605 numerically calculates the integral in the above expression (4) to calculate the predictive value vp of the present overvoltage from the current 102 passed through the battery 603 and the estimate ve of the overvoltage at the preceding sampling time.

The remaining capacity predictor 607 integrates for example the current 102 passed through the battery 603, measured by the current measuring unit 604, with the estimate of the remaining battery capacity 101 at the preceding sampling time stored in the remaining capacity storage 608, in order to predict the present remaining battery capacity. More specifically, when the estimate of the remaining battery capacity 101 at the preceding sampling time is Qe[C], and the predictive value of the remaining battery capacity 101 is Qp[C], the remaining capacity predictor 607 numerically calculates the predictive value Qp of the remaining battery capacity 101 using the following expression (5).

[Math. 5]

$$Q_p = Q_e + \int_{t-h}^{t} I(\tau) d\tau \quad (5)$$

The correction amount calculator 612 calculates correction amounts for overvoltage and the remaining battery capacity 101 for example by multiplying a differential voltage obtained by the difference calculator 611 by a prescribed coefficient. The overvoltage estimator 613 estimates the present overvoltage by subtracting the correction amount for the overvoltage calculated by the correction amount calculator 612 from the predictive value of the present overvoltage predicted by the overvoltage predictor 605 and has the estimate stored in the overvoltage storage.

The remaining capacity estimator 614 estimates the present remaining battery capacity 101 for example by subtracting the correction amount for the remaining battery capacity 101 calculated by the correction amount calculator 612 from the predictive value of the present remaining battery capacity 101 predicted by the remaining capacity predictor 607 and has the estimate stored in the remaining capacity storage 608.

Figure 8:
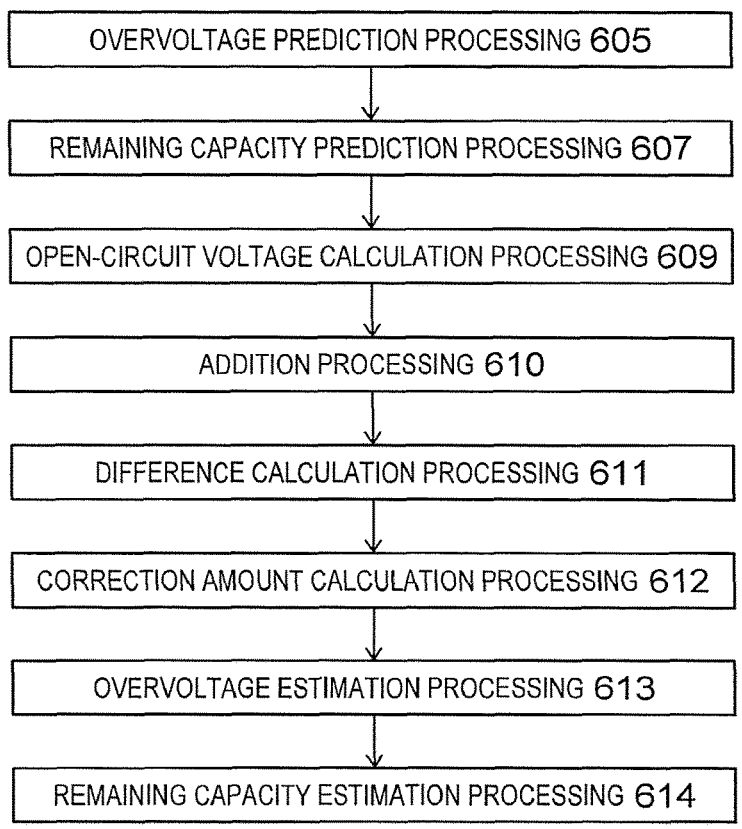
FIG. 8 is a flowchart for illustrating a series of processing steps carried out by the remaining battery capacity estimating device not according to the present invention.

FIG. 8 is a flowchart for illustrating a series of processing steps carried out by the remaining battery capacity estimating device 601 not according to the present invention, and the flowchart represents how the remaining battery capacity estimating device 601 shown in FIG. 6 is implemented as software. The processing steps correspond to the components described above in conjunction with FIG. 6.

Figure 9:
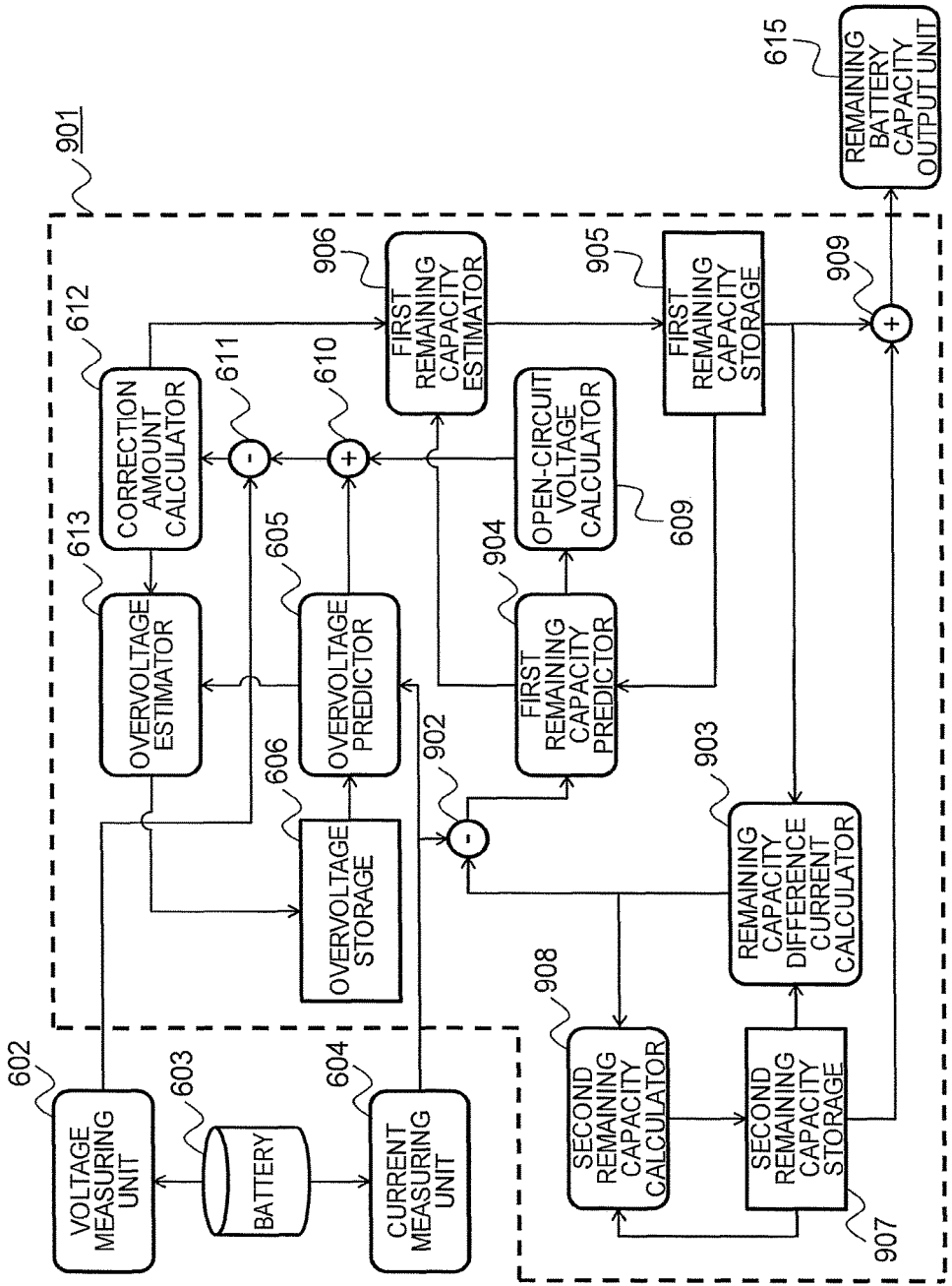
FIG. 9 is a diagram of an overall configuration of the remaining battery capacity estimating device according to the first embodiment of the present invention.

Now, a remaining battery capacity estimating device according to the first embodiment will be described in detail with reference to the drawings. FIG. 9 is a diagram showing an overall configuration of a remaining battery capacity estimating device 901 according to the first embodiment of the present invention. The following detailed description will center on differences from the conventional remaining battery capacity estimating device 601 not according to the present invention shown in FIG. 6.

The difference calculator 902 calculates the difference between current 102 through the battery 603 measured by the current measuring unit 604 and remaining capacity difference current calculated by a remaining capacity difference current calculator (current calculator) 903. A first remaining capacity predictor 904 calculates a predictive value of the first remaining battery capacity 301 from the current difference calculated by the difference calculator 902 and an estimate of the first remaining battery capacity 301 at the preceding sampling time stored in a first remaining capacity storage 905.

The first remaining capacity estimator 906 estimates the first remaining battery capacity 301 from the first remaining battery capacity 301 predicted by the first remaining capacity predictor 904 and the correction amount for the first remaining battery capacity 301 calculated by the correction amount calculator 612 and has the estimate stored in the first remaining capacity storage 905.

The first remaining capacity predictor 904, the first remaining capacity storage 905, and the first remaining capacity estimator 906 are different from the remaining capacity predictor 607, the remaining capacity storage 608, and the remaining capacity estimator 614 shown in FIG. 6 only in that these components predict, store, and estimate the first remaining battery capacity 301 instead of the remaining battery capacity 101.

A remaining capacity difference current calculator 903 calculates remaining capacity difference current, i.e., current passed through the control valve 303 on the basis of the estimate of the first remaining battery capacity 301 stored in the first remaining capacity storage 905 and the estimate of the second remaining battery capacity 302 stored in the second remaining capacity storage 907.

A second remaining capacity calculator 908 calculates a calculation value of the present second remaining battery capacity 302 from the remaining capacity difference current calculated by the remaining capacity difference current calculator 903 and an estimate of the second remaining battery capacity 302 at the preceding sampling time stored in the second remaining capacity storage 907 and has the estimate stored in the second remaining capacity storage 907.

An adder 909 adds the estimate of the first remaining battery capacity 301 stored in the first remaining capacity storage 905 and the calculation value of the second remaining battery capacity 302 stored in the second remaining capacity storage 907 and outputs the calculation value to a remaining battery capacity output unit 615.

Now, the operation of each component will be described more specifically using mathematical expressions. The first remaining capacity predictor 904 obtains a predictive value Q1p[C] of the first remaining battery capacity 301 by numerical calculation using the following expression (6) where Q1e[C] is an estimate of the first remaining battery capacity 301 at the preceding sampling time stored in the first remaining capacity storage 905 and Ii[A] is remaining capacity difference current calculated by the remaining capacity difference current calculator 903.

[Math. 6]

$$Q_{1p} = Q_{1e} + \int_{t-h}^{t} (I(\tau) - I_i(\tau)) d\tau \quad (6)$$

A second remaining capacity calculator 908 obtains an estimate of the present second remaining battery capacity 302 by numerical calculation using the following expression (7) on the basis of an estimate of the second remaining battery capacity 302 at the preceding sampling time stored in the second remaining capacity storage 907 and remaining capacity difference current I_i calculated by the remaining capacity difference current calculator 903.

[Math. 7]

$$Q_2(t) = Q_2(t-h) + \int_{t-h}^{t} I_i(\tau) d\tau \quad (7)$$

In a real battery, the first remaining battery capacity 301 corresponds to for example the amount of lithium stored between graphite layers in the carbon anode of a lithium ion secondary battery, and the second remaining battery capacity 302 corresponds to for example the amount of lithium having undergone an addition reaction with the graphite end.

When electro-chemical potentials in the respective reactions are E1 [J/mol] and E2 [J/mol], E1 and E2 are functions of the first remaining capacity Q1 [C] and the second remaining capacity Q2, respectively. Herein, the potential difference ΔE [J/mol] is represented by the following expression (8).

[Math. 8]

$$\Delta E = E_1 - E_2 \quad (8)$$

The remaining capacity difference current between the first remaining battery capacity 301 and the second remaining battery capacity 302 can be represented by a function such as the following expression (9) where λ1 is a prescribed potential difference 402 during charging, λ2 is a prescribed potential difference 502 during discharging, and κ1 and κ2 are prescribed parameters.

[Math. 9]

$$I_i = \kappa_1 e^{\Delta E / \lambda_1} - \kappa_2 e^{-\Delta E / \lambda_2} \quad (9)$$

In the expression, the first term on the right side represents a reaction rate in a forward reaction and the second term on the right side represents a reaction rate in a reverse reaction.

The remaining capacity difference current calculator 903 calculates remaining capacity difference current according to the above expression (9). The first exponential function in the expression (9) abruptly increases when the potential difference ΔE exceeds λ1, and current is passed from the first remaining battery capacity 301 to the second remaining battery capacity 302. This reduces the potential difference ΔE, and the potential difference ΔE is kept at λ1 or less as a result.

Conversely, when the potential difference ΔE is −λ2 or less, the second exponential function in the expression (9) abruptly increases, and current is passed from the second remaining battery capacity 302 to the first remaining battery capacity 301. This increases the potential difference ΔE, and the potential difference ΔE is kept at −λ2 or more as a result.

Figure 10:
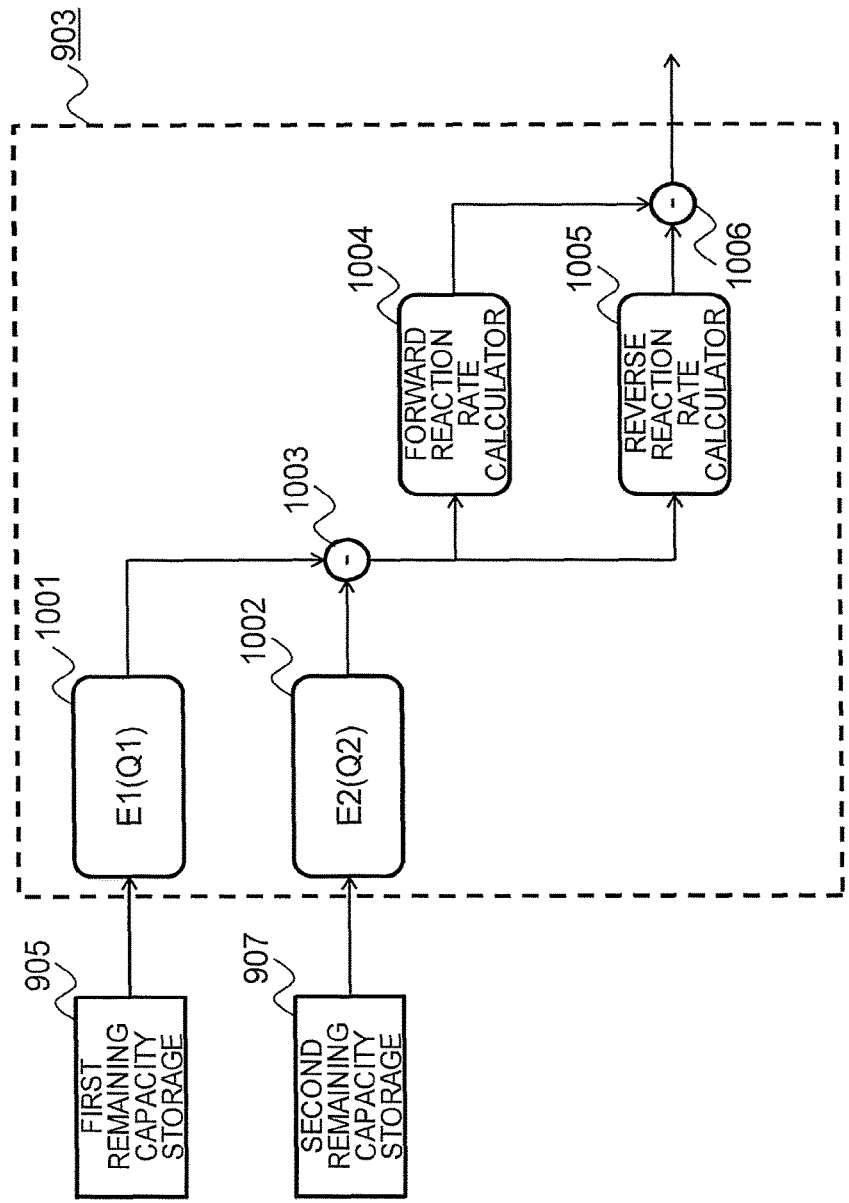
FIG. 10 is a diagram of a configuration of a remaining capacity difference current calculator according to the first embodiment of the present invention.

FIG. 10 is a diagram of a configuration of the remaining capacity difference current calculator 903 according to the first embodiment of the present invention. A first potential function calculator (first function calculator) 1001 calculates a value of a predetermined first potential function E1(Q1) from an estimate Q1 of the first remaining battery capacity 301 stored in the first remaining capacity storage 905.

A second potential function calculator (second function calculator) 1002 calculates a value of a predetermined second potential function E2(Q2) from an estimate Q2 of the second remaining battery capacity 302 stored in the second remaining capacity storage 907.

A difference calculator 1003 calculates the difference between the value of the first potential function calculated by the first potential function calculator 1001 and the value of the second potential function calculated by the second potential function calculator 1002.

A forward reaction rate calculator 1004 calculates a reaction rate in a forward reaction from the potential difference calculated by the difference calculator 1003. A reverse reaction rate calculator 1005 calculates a reaction rate in a reverse reaction from the potential difference calculated by the difference calculator 1003.

A difference calculator 1006 calculates the difference between the reaction rate in the forward reaction calculated by the forward reaction rate calculator 1004 and the reaction rate in the reverse reaction calculated by the reverse reaction rate calculator 1005 and outputs the difference as a remaining capacity difference current.

Figure 11:
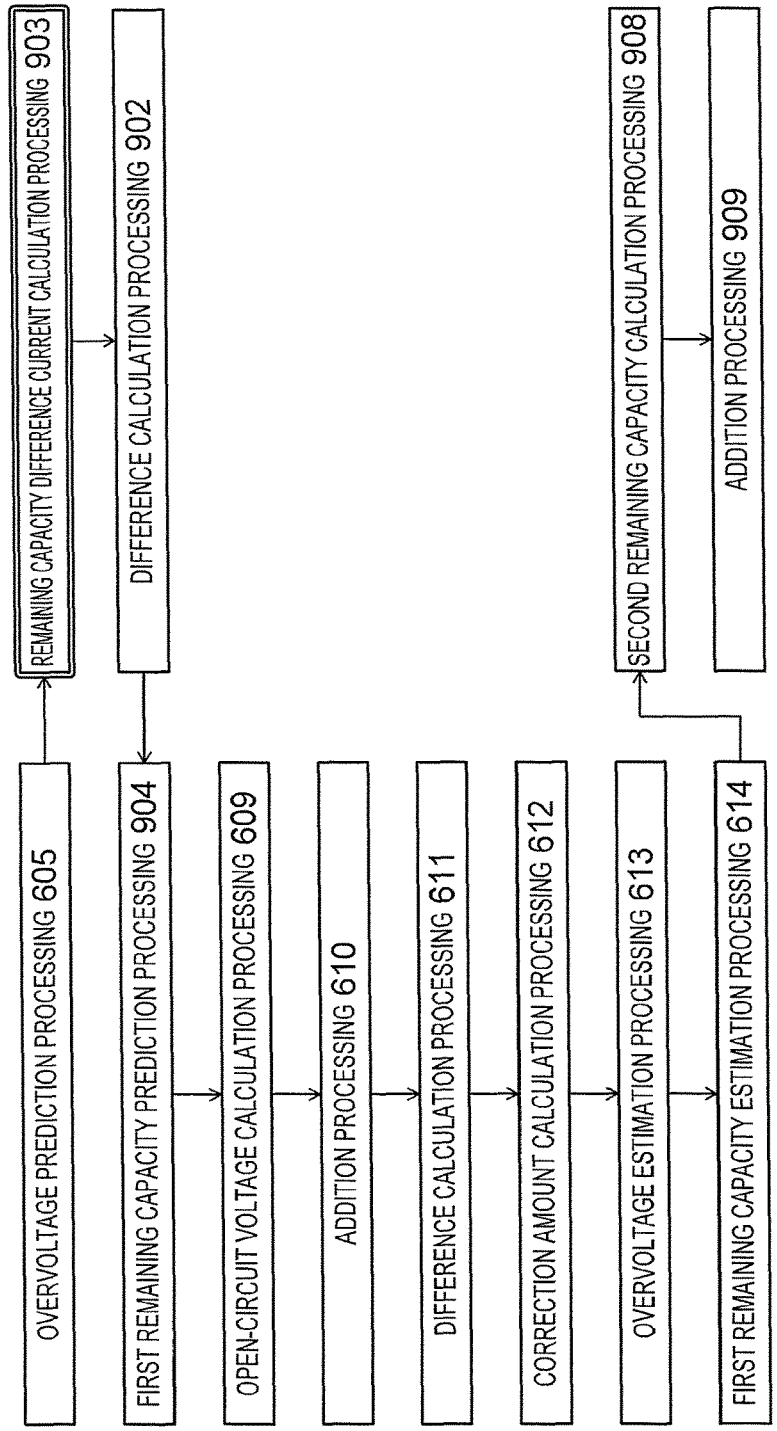
FIG. 11 is a flowchart for illustrating a series of processing steps carried out by the remaining battery capacity estimating device according to the first embodiment of the present invention.

FIG. 11 is a flowchart for illustrating a series of processing steps carried out by the remaining battery capacity estimating device 901 according to the first embodiment of the present invention, and the flowchart represents how the remaining battery capacity estimating device 901 according to the first embodiment shown in FIG. 9 is implemented as software. The processing steps correspond to the components described above in conjunction with FIG. 9.

Figure 12:
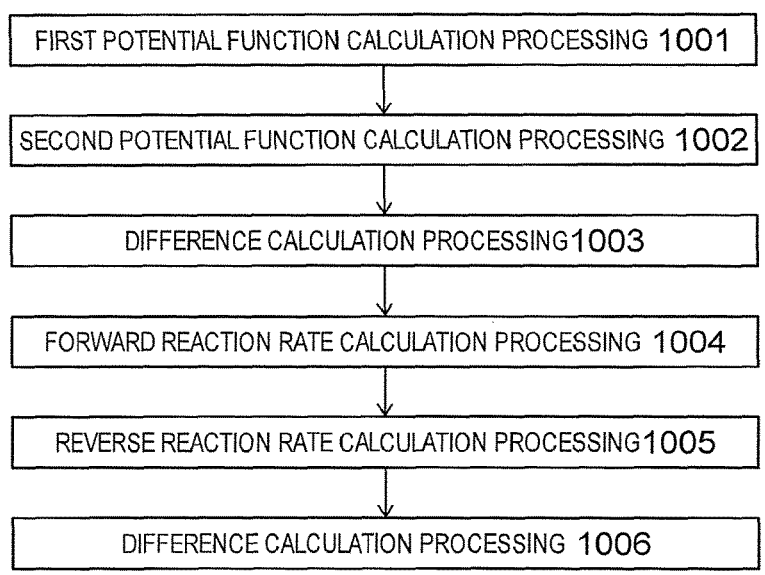
FIG. 12 is a flowchart for illustrating a series of processing steps carried out by a remaining capacity difference current calculator according to a first embodiment of the present invention.

FIG. 12 is a flowchart for illustrating a series of processing steps carried out by the remaining capacity difference current calculator 903 according to the first embodiment of the present invention, and the flowchart represents how the remaining capacity difference current calculator 903 according to the first embodiment shown in FIG. 10 is implemented as software. The processing steps correspond to the components described above in conjunction with FIG. 10.

Note that when the remaining battery capacity estimating device 901 according to the present invention is implemented as software, the processing order is not limited to that shown in the flowcharts in FIGS. 11 and 12. Among the respective calculation processing steps, change in the order is acceptable only if a prerequisite processing step is already carried out.

Among the elements of the remaining battery capacity estimating device 901 according to the present invention, the elements also included in the remaining battery capacity estimating device 601 not according to the present invention shown in FIG. 6 are not limited to those shown in FIG. 6. For example, the overvoltage estimator 613 and the remaining capacity estimator 614 that are arranged by a different approach from the first embodiment or the overvoltage predictor 605 and the overvoltage estimator 613 that are not strictly discrete may be employed in the embodiment of the invention if these devices are capable of estimating a remaining battery capacity based on current and voltage between terminals.

As in the foregoing, according to the first embodiment, the second remaining battery capacity not reflected on the open-circuit voltage of the battery as well as the first remaining battery capacity reflected on the open-circuit voltage of the battery are taken into account in estimating the remaining battery capacity. The phenomenon in which the remaining battery capacity varies in batteries with the same open-circuit voltage is accounted for by variations in the second remaining battery capacity not reflected on the open-circuit voltage. As a result, current between the remaining capacities is calculated on the basis of the first remaining capacity and the second remaining capacity, so that the remaining battery capacity can accurately be estimated even if the battery has hysteresis. More specifically, the present invention may be combined with any of known remaining battery capacity estimating devices, so that the remaining battery capacity can accurately be estimated from the current of the battery and the voltage between the terminals.

Second Embodiment

According to a second embodiment, a remaining battery capacity estimating device with an arrangement different from the first embodiment will be described. In the remaining battery capacity estimating device 901 according to the first embodiment, the first exponential function in the expression (9) abruptly increases when the potential difference $\Delta E$ exceeds $\lambda 1$, and current is passed from the first remaining battery capacity 301 to the second remaining battery capacity 302. This reduces the potential difference $\Delta E$, and the potential difference $\Delta E$ is kept at $\lambda 1$ or less as a result.

Conversely, when the potential difference $\Delta E$ is $-\lambda 2$ or less, the second exponential function in the expression (9) abruptly increases, and current is passed from the second remaining battery capacity 302 to the first remaining battery capacity 301. This increases the potential difference $\Delta E$, and the potential difference $\Delta E$ is kept at $-\lambda 2$ or more as a result.

In this way, when the potential difference $\Delta E$ is $\lambda 1$ or $-\lambda 2$, the relation represented by the following expression (10) is established.

[Math. 10]

$$\frac{d\Delta E}{dt} = \frac{\partial E_1}{\partial Q_1}\frac{dQ_1}{dt} - \frac{\partial E_2}{\partial Q_2}\frac{dQ_2}{dt} \qquad (10)$$
$$= \frac{\partial E_1}{\partial Q_1}(I - I_i) - \frac{\partial E_2}{\partial Q_2}I_i$$
$$= 0$$

Then, when the expression (10) is solved, remaining capacity difference current I_i is represented by the following expression (11).

[Math. 11]

$$I_i = \frac{\frac{\partial E_1}{\partial Q_1}}{\frac{\partial E_1}{\partial Q_1} + \frac{\partial E_2}{\partial Q_2}}I \qquad (11)$$

When the potential difference $\Delta E$ is greater than $-\lambda 2$ and less than $\lambda 1$, the exponential function in expression (9) takes a very small value in any case. Therefore, the remaining capacity difference current may be regarded as zero.

Figure 13:
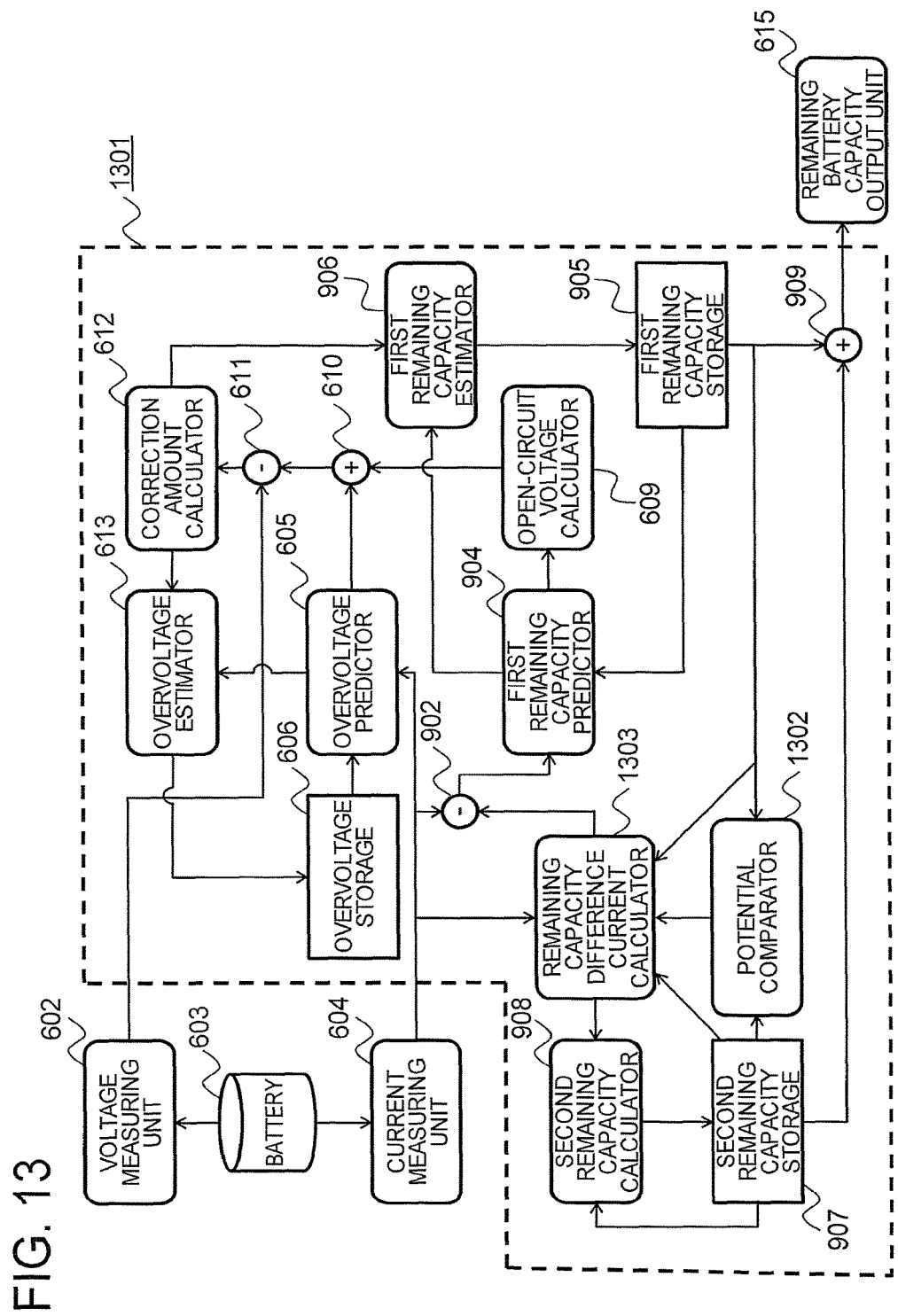
FIG. 13 is a diagram of an overall configuration of a remaining battery capacity estimating device according to a second embodiment of the present invention.

The remaining battery capacity estimating device according to the second embodiment is based on the facts described above. FIG. 13 is a diagram of an overall configuration of a remaining battery capacity estimating device 1301 according to the second embodiment of the present invention. Now, the following detailed description will center on differences from the remaining battery capacity estimating device 901 according to the first embodiment shown in FIG. 9.

A potential comparator 1302 calculates a potential difference from an estimate of the first remaining battery capacity 301 stored in the first remaining capacity storage 905 and an estimate of the second remaining battery capacity 302 stored in the second remaining capacity storage 907. The potential comparator 1302 compares the calculated potential difference to a prescribed potential difference 402 during charging or a prescribed potential difference 502 during discharging.

A remaining capacity difference current calculator 1303 calculates remaining capacity difference current on the basis of the comparison result of the potential comparator 1302, the estimate of the first remaining battery capacity 301 stored in the first remaining capacity storage 905, the estimate of the second remaining battery capacity 302 stored in the second remaining capacity storage 907, and current 102 measured by the current measuring unit 604.

Figure 14:
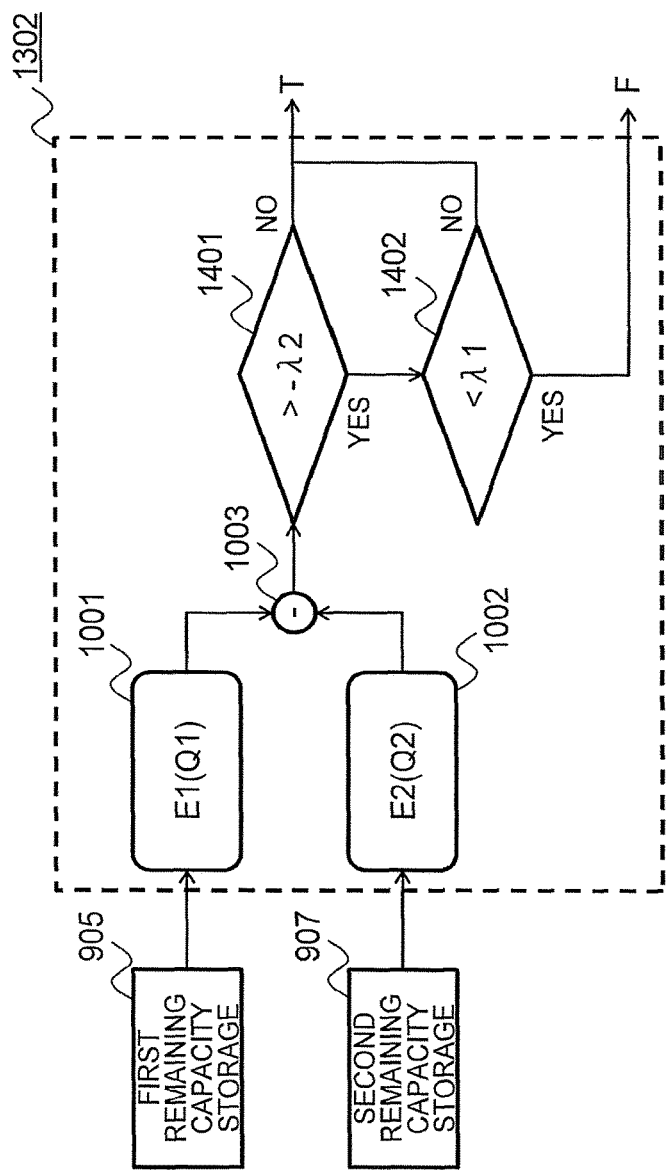
FIG. 14 is a diagram of a potential comparator according to the second embodiment of the present invention.

FIG. 14 is a diagram of a configuration of a potential comparator 1302 according to the second embodiment of the present invention. The first potential function calculator 1001 calculates a potential function E1 for a predetermined first remaining capacity from the estimate of the first remaining battery capacity 301 stored in the first remaining capacity storage 905. The second potential function calculator 1002 calculates a potential function E2 for a predetermined second remaining capacity from the estimate of the second remaining battery capacity 302 stored in the second remaining capacity storage 907.

The difference calculator 1003 calculates the difference between the potential E1 for the first remaining capacity calculated by the first potential function calculator 1001 and the potential E2 for the second remaining capacity calculated by the second potential function calculator 1002, i.e., the potential difference $\Delta E$.

A comparator 1401 compares the potential difference $\Delta E$ and the prescribed potential difference $-\lambda 2$ and outputs T to the remaining capacity difference current calculator 1303 if $\Delta E$ is equal to or less than $-\lambda 2$. Otherwise, a comparator 1402 compares $\Delta E$ and the prescribed potential difference $\lambda 1$ and outputs T to the remaining capacity difference current calculator 1303 if $\Delta E$ is equal to or more than $\lambda 1$, and F if not.

Figure 15:
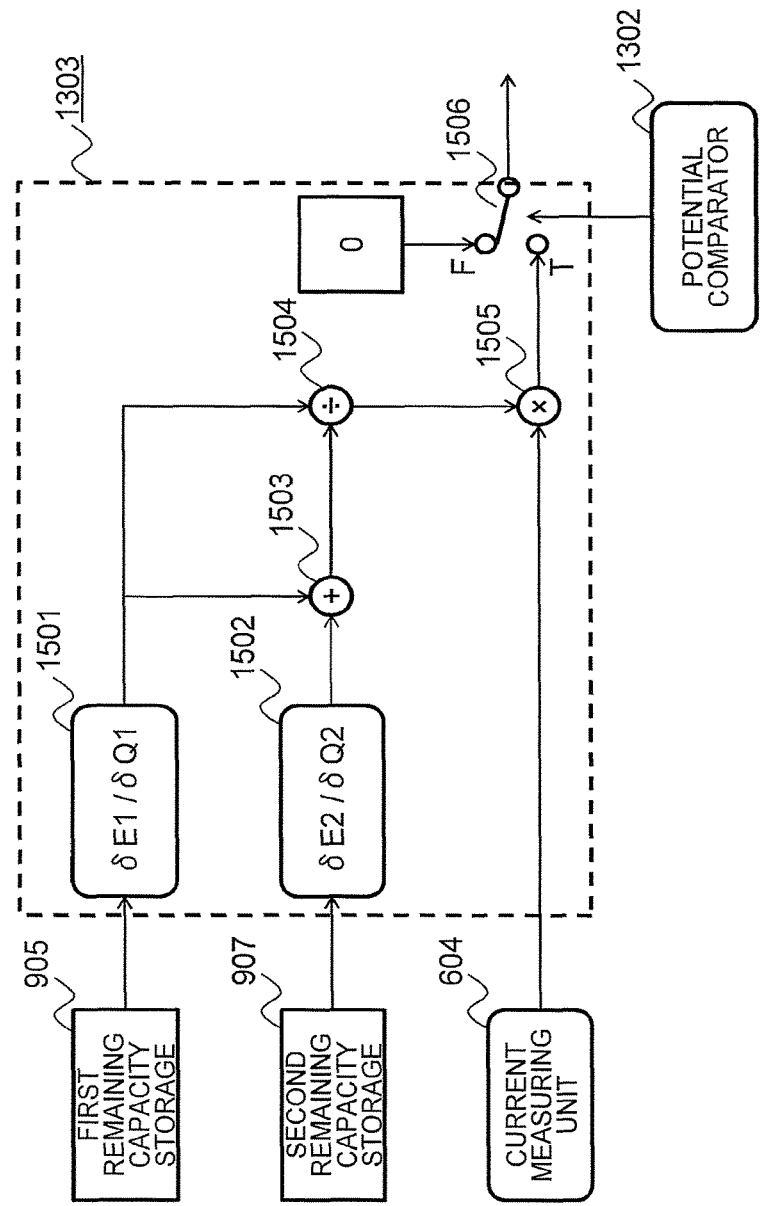
FIG. 15 is a diagram of a remaining capacity difference current calculator according to the second embodiment of the present invention.

FIG. 15 is a diagram of a configuration of the remaining capacity difference current calculator 1303 according to the second embodiment of the present invention. A first partial differential calculator 1501 calculates a partial differential coefficient related to the first remaining capacity Q1 for the potential function E1 from the estimate of the first remaining battery capacity 301 stored in the first remaining capacity storage 905. A second partial differential calculator 1502 calculates a partial differential coefficient related to the second remaining capacity Q2 for the potential function E2 from the estimate of the second remaining battery capacity 302 stored in the second remaining capacity storage 907.

An adder 1503 adds the partial differential coefficient calculated by the first partial differential calculator 1501 and the partial differential coefficient calculated by the second partial differential calculator 1502. A divider 1504 divides the partial differential coefficient calculated by the first partial differential calculator 1501 by the partial differential coefficient calculated by the adder 1503.

A multiplier 1505 calculates the product of the partial differential coefficient ratio calculated by the divider 1504 and battery current measured by the current measuring unit 604. A selector 1506 outputs, as remaining capacity difference current, the value calculated by the multiplier 1505 if the potential comparator 1302 outputs T, and zero if the comparator outputs F.

Figure 16:
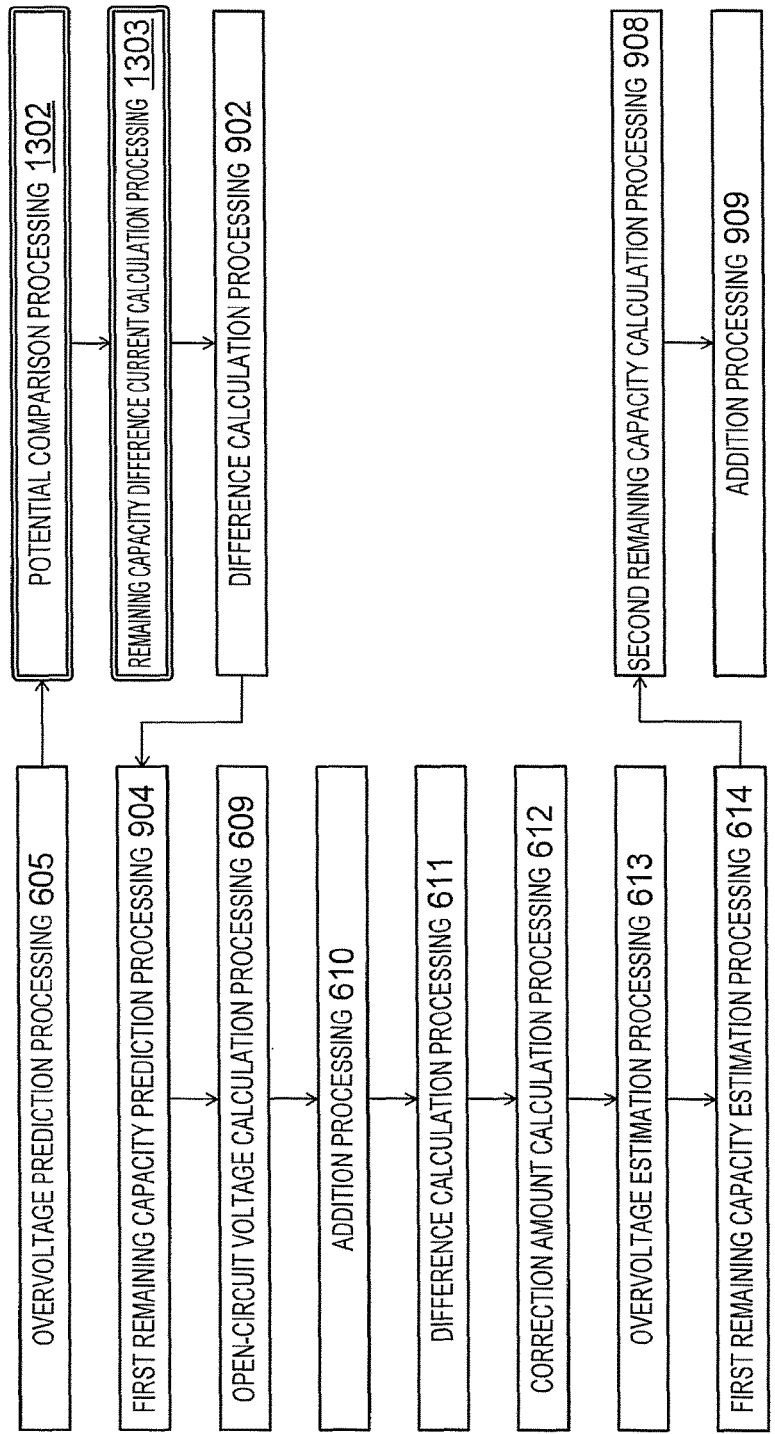
FIG. 16 is a flowchart for illustrating a series of processing steps carried out by the remaining battery capacity estimating device according to the second embodiment of the present invention.

FIG. 16 is a flowchart for illustrating a series of processing steps carried out by the remaining battery capacity estimating device 1301 according to the second embodiment of the present invention, and the flowchart represents how the remaining battery capacity estimating device 1301 according to the second embodiment shown in FIG. 13 is implemented as software. The processing steps correspond to the components described in conjunction with FIG. 13.

Figure 17:
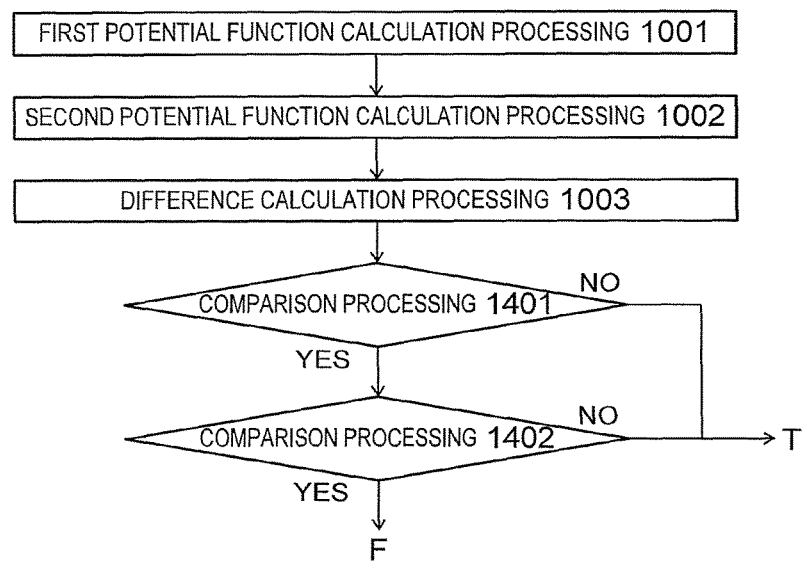
FIG. 17 is a flowchart for illustrating a series of processing steps carried out by a potential comparator according to the second embodiment of the present invention.

FIG. 17 is a flowchart for illustrating a series of processing steps carried out by the potential comparator 1302 according to the second embodiment of the present invention, and the flowchart represents how the potential comparator 1302 according to the second embodiment shown in FIG. 14 is implemented as software. The processing steps correspond to the components described above in conjunction with FIG. 14.

Figure 18:
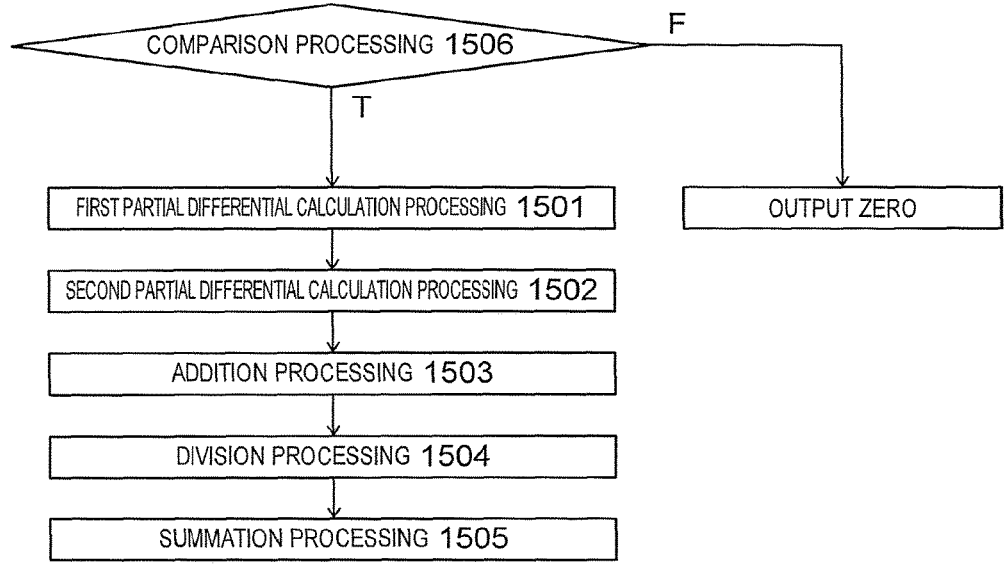
FIG. 18 is a flowchart for illustrating a series of processing steps carried out by the remaining capacity difference current calculator according to the second embodiment of the present invention.

FIG. 18 is a flowchart for illustrating a series of processing steps carried out by the remaining capacity difference current calculator 1303 according to the second embodiment of the present invention, and the flowchart represents how the remaining capacity difference current calculator 1303 according to the second embodiment shown in FIG. 15 is implemented as software. The processing steps correspond to the components described above in conjunction with FIG. 15.

Note that when the remaining battery capacity estimating device 1301 according to the second embodiment is implemented as software, the processing order is not limited to that shown in the flowcharts in FIGS. 16, 17, and 18. Among the respective calculating processing steps, change in the processing order is acceptable only if prerequisite processing is already carried out. Note however that in FIG. 18, the processing order according to the second embodiment can advantageously reduce the amount of calculation because unnecessary processing can be omitted when the comparison processing of the potential comparator 1302 outputs F.

The remaining battery capacity estimating device 901 according to the first embodiment calculates a reaction rate in a forward reaction with the forward reaction rate calculator 1004 and a reaction rate in a reverse reaction with the reverse reaction rate calculator 1005. However, the reaction rates in the forward and reverse reactions are exponential function of the potential difference ΔE and when the potential difference is a large value, the reaction rate would be a very large value.

This would impose restrictions when the remaining battery capacity estimating device 901 according to the present invention is implemented as software in a computer integrated in a device, and also remaining capacity difference current may diverge depending on a temporal resolution in calculation. These disadvantages would be solved according to the second embodiment.

As in the foregoing, according to the second embodiment, even when a battery has hysteresis, its remaining battery capacity can accurately be estimated similarly to the first embodiment and the disadvantages associated with the first embodiment can be solved.

Note that in FIG. 13, the potential comparator 1302 and the remaining capacity difference current calculator 1303 are illustrated as discrete components, while the function of the potential comparator 1302 may be integrated in the remaining capacity difference current calculator 1303.

Third Embodiment

It is generally known that the first potential function and the second potential function according to the second embodiment are represented by the following expression (12) with prescribed parameters $\alpha_{p1}$, $\alpha_{p2}$, $\alpha_{n1}$, $\alpha_{n2}$, $\beta_{p1}$, $\beta_{p2}$, $\beta_{n1}$, $\beta_{n2}$, $\gamma_1$, $\gamma_2$, $\delta_1$, and, $\delta_2$.

[Math. 12]

$$E_1(Q_1) = \alpha_{p1} \log(Q_1 + \beta_{p1}) - \alpha_{n1} \log(\beta_{n1} - Q_1) + \gamma_1 Q_1 + \delta_1,$$

$$E_2(Q_2) = \alpha_{p2} \log(Q_2 + \beta_{p2}) - \alpha_{n2} \log(\beta_{n2} - Q_2) + \gamma_2 Q_2 + \delta_2 \quad (12)$$

In the expression, when $\beta_{n1}$ and $\beta_{n2}$ are sufficiently larger than Q1 and Q2, the logarithmic function can be approximated by a linear function with high accuracy. Also, $\alpha_{p1}$ and $\alpha_{p2}$ both represent a reaction of graphite and lithium ions and are expected to take close values. Depending on the kind of the battery 603, the terms with γ1 and γ2 including approximation of logarithmic functions are substantially zero in some cases.

In this case, the potentials of the first remaining battery capacity 301 and the second remaining battery capacity 302 can be represented by the following expression (13) with α, $\beta_{p1}$, $\beta_{p2}$, $\delta_1$, and $\delta_2$ as parameters.

[Math. 13]

$$E_1(Q_1) = \alpha \log(Q_1 + \beta_{p1}) + \delta_1,$$

$$E_2(Q_2) = \alpha \log(Q_2 + \beta_{p2}) + \delta_2 \quad (13)$$

When this is substituted in the expression (8), ΔE is given by the following expression (14) where δ is δ1-δ2.

[Math. 14]

$$\Delta E = \alpha \log \frac{Q_1 + \beta_{p1}}{Q_2 + \beta_{p2}} + \delta \quad (14)$$

In the expression, whether ΔE is less than the prescribed potential difference λ1 is equivalent to whether the following inequality (15) is established.

[Math. 15]

$$e^{\frac{\lambda_2 - \delta}{\alpha}} Q_2 + \left(e^{\frac{\lambda_2 - \delta}{\alpha}} \beta_{p2} - \beta_{p1}\right) < Q_1 < e^{\frac{\lambda_1 - \delta}{\alpha}} Q_2 + \left(e^{\frac{\lambda_1 - \delta}{\alpha}} \beta_{p2} - \beta_{p1}\right) \quad (15)$$

Therefore, the potential comparator 1302 can be substituted by determination of whether the expression (14) is established without calculating the potential functions E1 and E2.

Figure 19:
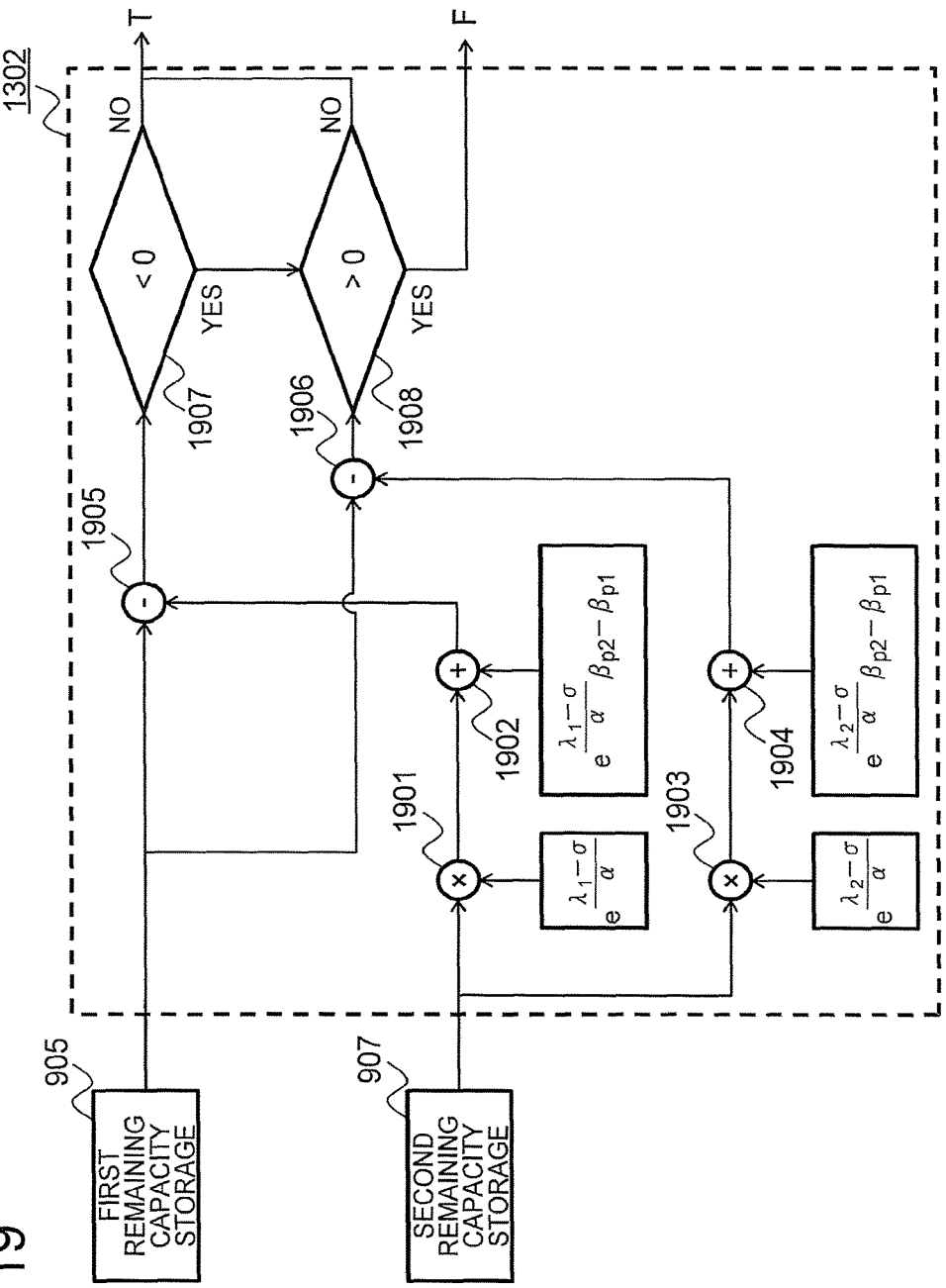
FIG. 19 is a diagram of a configuration of a potential comparator according to a third embodiment of the present invention.

The remaining battery capacity estimating device according to the third embodiment is based on the facts described above. FIG. 19 is a diagram of a configuration of the potential comparator 1302 according to the third embodiment of the present invention. A multiplier 1901 multiplies the estimate of the second remaining battery capacity 302 stored in the second remaining capacity storage 907 by a prescribed coefficient.

An adder 1902 adds a prescribed coefficient to the value calculated by the multiplier 1901. The multiplier 1903 multiplies the estimate of the second remaining battery capacity 302 stored in the second remaining capacity storage 907 by a prescribed coefficient. An adder 1904 adds a prescribed coefficient to the value calculated by the multiplier 1903.

A difference calculator 1905 subtracts the value obtained by the addition by the adder 1902 from the estimate of the first remaining battery capacity 301 stored in the first remaining capacity storage 905. A difference calculator 1906 subtracts the value obtained by the addition by the adder 1904 from the estimate of the first remaining battery capacity 301 stored in the first remaining capacity storage 905.

A comparator 1907 determines whether the value calculated by the difference calculator 1905 is at least zero. The comparator 1907 outputs T if the value calculated by the difference calculator 1905 is zero or more, and otherwise a comparator 1908 determines whether the value calculated by the difference calculator 1906 is at most zero and outputs F if the value is zero or less, and outputs T if not.

Figure 20:
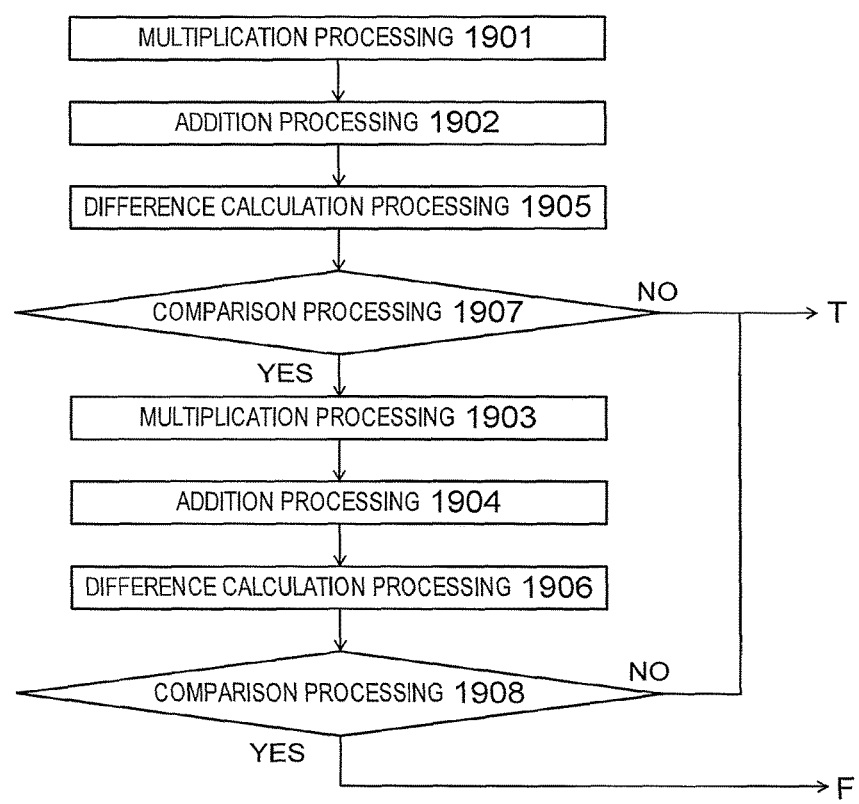
FIG. 20 is a flowchart for illustrating a series of processing steps carried out by the potential comparator according to the third embodiment of the present invention.

FIG. 20 is a flowchart for illustrating a series of processing steps carried out by the potential comparator 1302 according to the third embodiment of the present invention, and the flowchart represents how the potential comparator 1302 according to the third embodiment shown in FIG. 19 is implemented as software. The processing steps correspond to the components in FIG. 19.

Note that when the remaining battery capacity estimating device according to the third embodiment is implemented as software, the processing order is not limited to that shown in the flowchart in FIG. 20. Change in the processing order is acceptable only if prerequisite processing for each calculating step is already carried out. Note however that the processing order according to the third embodiment can advantageously reduce the amount of calculation because unnecessary processing can be omitted when the comparison processing of the potential comparator 1302 outputs F.

As in the foregoing, according to the third embodiment, the potential comparator can be formed using multiplication, summation and comparison with zero related to the first and second remaining battery capacities. As a result, the same advantages as those provided by the second embodiment may be obtained while the amount of calculation for estimating the remaining battery capacity can be reduced.

The invention claimed is:

1. A remaining battery capacity estimating device for estimating a remaining battery capacity from inter-terminal voltage of a battery and current passed through the battery, comprising:
    a current measuring unit that measures the current;
    a voltage measuring unit that measures the inter-terminal voltage;
    a first remaining capacity storage that stores a first remaining battery capacity as a remaining battery capacity correlated with open-circuit voltage of the battery;
    a second remaining capacity storage that stores a second remaining battery capacity produced by subtracting the first remaining battery capacity from the remaining battery capacity that increases and decreases by the current;
    a current calculator that calculates remaining capacity difference current between the first remaining battery capacity and the second remaining battery capacity;
    a first remaining capacity estimator that estimates the first remaining battery capacity on the basis of a value obtained by removing the remaining capacity difference current from the current and the inter-terminal voltage and has the estimate stored in the first remaining capacity storage;
    a second remaining capacity calculator that calculates the second remaining battery capacity by adding up the remaining capacity difference current and has the result stored in the second remaining capacity storage; and
    an adder that obtains the remaining battery capacity by adding the first remaining battery capacity and the second remaining battery capacity,
    wherein the remaining capacity difference current of the current calculator being, when the battery is charged, a current value that allows the second remaining battery capacity to be smaller than the first remaining battery capacity by a quantity corresponding to a first potential difference as a potential difference during battery charging, and
    the remaining capacity difference current of the current calculator being, when the battery is discharged, a current value that allows the first remaining battery capacity to be smaller than the second remaining battery capacity by a quantity corresponding to a second potential difference as a potential difference during battery discharging.

2. The remaining battery capacity estimating device of claim 1, wherein the current calculator comprises:
    a first function calculator that calculates a first electro-chemical potential corresponding to a first remaining capacity from the estimate of the first remaining battery capacity stored in the first remaining capacity storage;
    a second function calculator that calculates a second electro-chemical potential corresponding to a second remaining battery capacity from the second remaining battery capacity stored in the second remaining capacity storage;
    a first difference calculator that calculates a difference between the first electro-chemical potential and the second electro-chemical potential as a difference value;
    a forward reaction rate calculator that calculates a forward reaction rate by a first exponential function defined by the difference value and the first potential difference;
    a reverse reaction rate calculator that calculates a reverse reaction rate by a second exponential function defined by the difference value and the second potential difference; and
    a second difference calculator that produces, as a reaction rate difference, a difference between the forward reaction rate and the reverse reaction rate and obtains the produced reaction rate difference as the remaining capacity difference current.

3. The remaining battery capacity estimating device of claim 2, comprising:
    an overvoltage storage that stores overvoltage of the battery;
    a first remaining capacity predictor that predicts a first remaining battery capacity at a present sampling time by integrating a value produced by subtracting the remaining capacity difference current from the current measured by the current measuring unit with respect to an estimate of the first remaining battery capacity at a preceding sampling time stored in the first remaining capacity storage;

an overvoltage predictor that predicts overvoltage of the battery from the current measured by the current measuring unit;

an open-circuit voltage calculator that calculates open-circuit voltage of the battery from the predictive value of the first remaining battery capacity predicted by the first remaining capacity predictor;

an adder that adds the battery overvoltage predicted by the overvoltage predictor and the battery open-circuit voltage calculated by the open-circuit voltage calculator;

a difference calculator that calculates a difference between the voltage value obtained by the addition by the adder and the inter-terminal voltage measured by the voltage measuring unit;

a correction amount calculator that calculates correction amounts for the overvoltage and the first remaining battery capacity from the voltage difference value calculated by the difference calculator; and an overvoltage estimator that calculates an estimate of overvoltage at a present sampling time by correcting the predictive value of overvoltage at the present sampling time predicted by the overvoltage predictor with the correction amount for the overvoltage calculated by the correction amount calculator, and has the estimate stored in the overvoltage storage, wherein the first remaining capacity estimator calculating an estimate of the first remaining battery capacity at the present sampling time by correcting the predictive value of the first remaining battery capacity at the present sampling time predicted by the first remaining capacity predictor with the correction amount for the first remaining battery capacity calculated by the correction amount calculator, and having the estimate stored in the first remaining capacity storage.

4. The remaining battery capacity estimating device of claim 1, wherein the current calculator further comprises:

a first function calculator that calculates a first electro-chemical potential corresponding to a first remaining capacity from the first remaining battery capacity stored in the first remaining capacity storage;

a second function calculator that calculates a second electro-chemical potential corresponding to a second remaining capacity from the second remaining battery capacity stored in the second remaining capacity storage;

a first partial differential calculator that calculates a first partial differential coefficient, related to the first remaining battery capacity, for the first electro-chemical potential from the first remaining battery capacity stored in the first remaining capacity storage;

a second partial differential calculator that calculates a second partial differential coefficient, related to the second remaining battery capacity, for the second electro-chemical potential from the second remaining battery capacity stored in the second remaining capacity storage;

an adder that adds the first partial differential coefficient and the second partial differential coefficient;

a divider that divides the first partial differential coefficient by the sum calculated by the adder;

a multiplier that multiplies the current measured by the current measuring unit by the division value calculated by the divider; and a selector that selects zero for the remaining capacity difference current when the first electro-chemical potential is smaller than a value produced by adding the first potential difference to the second electro-chemical potential and greater than a value produced by subtracting the second potential difference from the second electro-chemical potential, or otherwise selects the multiplication value calculated by the multiplier for the remaining capacity difference value.

5. The remaining battery capacity estimating device of claim 4, wherein the current calculator further comprises:

a difference calculator that calculates a difference between the first electro-chemical potential and the second electro-chemical potential as a difference value, and the selector selects zero for the remaining capacity difference current when the difference value is greater than a value produced by making the second potential difference negative and smaller than the first potential difference and selects the multiplication value calculated by the multiplier for the remaining capacity difference current when the difference value is equal to or less than the value produced by making the second potential difference negative or equal to or more than the first potential difference.

6. The remaining battery capacity estimating device of claim 5, comprising:

an overvoltage storage that stores overvoltage of the battery;

a first remaining capacity predictor that predicts a first remaining battery capacity at a present sampling time by integrating a value produced by subtracting the remaining capacity difference current from the current measured by the current measuring unit with respect to an estimate of the first remaining battery capacity at a preceding sampling time stored in the first remaining capacity storage;

an overvoltage predictor that predicts overvoltage of the battery from the current measured by the current measuring unit;

an open-circuit voltage calculator that calculates open-circuit voltage of the battery from the predictive value of the first remaining battery capacity predicted by the first remaining capacity predictor;

an adder that adds the battery overvoltage predicted by the overvoltage predictor and the battery open-circuit voltage calculated by the open-circuit voltage calculator;

a difference calculator that calculates a difference between the voltage value obtained by the addition by the adder and the inter-terminal voltage measured by the voltage measuring unit;

a correction amount calculator that calculates correction amounts for the overvoltage and the first remaining battery capacity from the voltage difference value calculated by the difference calculator; and an overvoltage estimator that calculates an estimate of overvoltage at a present sampling time by correcting the predictive value of overvoltage at the present sampling time predicted by the overvoltage predictor with the correction amount for the overvoltage calculated by the correction amount calculator, and has the estimate stored in the overvoltage storage, wherein the first remaining capacity estimator calculating an estimate of the first remaining battery capacity at the present sampling time by correcting the predictive value of the first remaining battery capacity at the present sampling time predicted by the first remaining capacity predictor with the correction amount for the first remaining battery capacity calculated by the correction amount calculator, and having the estimate stored in the first remaining capacity storage.

7. The remaining battery capacity estimating device of claim 4, wherein the current calculator further comprises:
a first subtracter that produces a first comparison value by multiplying the second remaining battery capacity stored in the second remaining capacity storage by a prescribed first coefficient, adding a prescribed second coefficient to the result, and subtracting the result from the first remaining battery capacity stored in the first remaining capacity storage;
a second subtracter that produces a second comparison value by multiplying the second remaining battery capacity stored in the second remaining capacity storage by a prescribed third coefficient, adding a prescribed fourth coefficient to the result, and subtracting the result from the first remaining battery capacity stored in the first remaining capacity storage;
a first comparator that compares whether the first comparison value is less than zero; and
a second comparator that compares whether the second comparison value exceeds zero,
wherein the selector selects zero for the remaining capacity difference current when the first comparator determines that the first comparison value is less than zero and the second comparator determines that the second comparison value exceeds zero and selects the division value calculated by the divider for the remaining capacity difference current when the first comparator determines that the first comparison value is not less than zero or the second comparator determines that the second comparison value does not exceed zero.

8. The remaining battery capacity estimating device of claim 7, comprising:
an overvoltage storage that stores overvoltage of the battery;
a first remaining capacity predictor that predicts a first remaining battery capacity at a present sampling time by integrating a value produced by subtracting the remaining capacity difference current from the current measured by the current measuring unit with respect to an estimate of the first remaining battery capacity at a preceding sampling time stored in the first remaining capacity storage;
an overvoltage predictor that predicts overvoltage of the battery from the current measured by the current measuring unit;
an open-circuit voltage calculator that calculates open-circuit voltage of the battery from the predictive value of the first remaining battery capacity predicted by the first remaining capacity predictor;
an adder that adds the battery overvoltage predicted by the overvoltage predictor and the battery open-circuit voltage calculated by the open-circuit voltage calculator;
a difference calculator that calculates a difference between the voltage value obtained by the addition by the adder and the inter-terminal voltage measured by the voltage measuring unit;
a correction amount calculator that calculates correction amounts for the overvoltage and the first remaining battery capacity from the voltage difference value calculated by the difference calculator; and
an overvoltage estimator that calculates an estimate of overvoltage at a present sampling time by correcting the predictive value of overvoltage at the present sampling time predicted by the overvoltage predictor with the correction amount for the overvoltage calculated by the correction amount calculator, and has the estimate stored in the overvoltage storage,
wherein the first remaining capacity estimator calculating an estimate of the first remaining battery capacity at the present sampling time by correcting the predictive value of the first remaining battery capacity at the present sampling time predicted by the first remaining capacity predictor with the correction amount for the first remaining battery capacity calculated by the correction amount calculator, and having the estimate stored in the first remaining capacity storage.

9. The remaining battery capacity estimating device of claim 4, comprising:
an overvoltage storage that stores overvoltage of the battery;
a first remaining capacity predictor that predicts a first remaining battery capacity at a present sampling time by integrating a value produced by subtracting the remaining capacity difference current from the current measured by the current measuring unit with respect to an estimate of the first remaining battery capacity at a preceding sampling time stored in the first remaining capacity storage;
an overvoltage predictor that predicts overvoltage of the battery from the current measured by the current measuring unit;
an open-circuit voltage calculator that calculates open-circuit voltage of the battery from the predictive value of the first remaining battery capacity predicted by the first remaining capacity predictor;
an adder that adds the battery overvoltage predicted by the overvoltage predictor and the battery open-circuit voltage calculated by the open-circuit voltage calculator;
a difference calculator that calculates a difference between the voltage value obtained by the addition by the adder and the inter-terminal voltage measured by the voltage measuring unit;
a correction amount calculator that calculates correction amounts for the overvoltage and the first remaining battery capacity from the voltage difference value calculated by the difference calculator; and
an overvoltage estimator that calculates an estimate of overvoltage at a present sampling time by correcting the predictive value of overvoltage at the present sampling time predicted by the overvoltage predictor with the correction amount for the overvoltage calculated by the correction amount calculator, and has the estimate stored in the overvoltage storage,
wherein the first remaining capacity estimator calculating an estimate of the first remaining battery capacity at the present sampling time by correcting the predictive value of the first remaining battery capacity at the present sampling time predicted by the first remaining capacity predictor with the correction amount for the first remaining battery capacity calculated by the correction amount calculator, and having the estimate stored in the first remaining capacity storage.

10. The remaining battery capacity estimating device of claim 1, comprising:
an overvoltage storage that stores overvoltage of the battery;
a first remaining capacity predictor that predicts a first remaining battery capacity at a present sampling time by integrating a value produced by subtracting the remaining capacity difference current from the current measured by the current measuring unit with respect to an estimate of the first remaining battery capacity at a preceding sampling time stored in the first remaining capacity storage;

an overvoltage predictor that predicts overvoltage of the battery from the current measured by the current measuring unit;

an open-circuit voltage calculator that calculates open-circuit voltage of the battery from the predictive value of the first remaining battery capacity predicted by the first remaining capacity predictor;

an adder that adds the battery overvoltage predicted by the overvoltage predictor and the battery open-circuit voltage calculated by the open-circuit voltage calculator;

a difference calculator that calculates a difference between the voltage value obtained by the addition by the adder and the inter-terminal voltage measured by the voltage measuring unit;

a correction amount calculator that calculates correction amounts for the overvoltage and the first remaining battery capacity from the voltage difference value calculated by the difference calculator; and an overvoltage estimator that calculates an estimate of overvoltage at a present sampling time by correcting the predictive value of overvoltage at the present sampling time predicted by the overvoltage predictor with the correction amount for the overvoltage calculated by the correction amount calculator, and has the estimate stored in the overvoltage storage, wherein the first remaining capacity estimator calculating an estimate of the first remaining battery capacity at the present sampling time by correcting the predictive value of the first remaining battery capacity at the present sampling time predicted by the first remaining capacity predictor with the correction amount for the first remaining battery capacity calculated by the correction amount calculator, and having the estimate stored in the first remaining capacity storage.

11. A method for estimating a remaining battery capacity from inter-terminal voltage of a battery and current passed through the battery, comprising:

a current calculating step of calculating remaining capacity difference current between a first remaining battery capacity and a second remaining battery capacity, the first remaining battery capacity being a remaining battery capacity correlated with open-circuit voltage of the battery, the second remaining battery capacity being obtained by subtracting the first remaining battery capacity from the remaining battery capacity that increases and decreases by the current measured by a current measuring unit;

a first remaining capacity estimating step of estimating the first remaining battery capacity on the basis of a value obtained by removing the remaining capacity difference current from the current and the inter-terminal voltage and having the estimate stored in a first remaining capacity storage;

a second remaining capacity calculating step of calculating the second remaining battery capacity by adding up the remaining capacity difference current and having the result stored in a second remaining capacity storage; and an addition step of obtaining the remaining battery capacity by adding the first remaining battery capacity and the second remaining battery capacity, wherein the remaining capacity difference current calculated in the current calculating step being, when the battery is charged, a current value that allows the second remaining battery capacity to be smaller than the first remaining battery capacity by a quantity corresponding to a first potential difference as a potential difference during battery changing, and, when the battery is discharged, a current value that allows the first remaining battery capacity to be smaller than the second remaining battery capacity by a quantity corresponding to a second potential difference as a potential difference during battery discharging.

* * * * *